US010896987B2

(12) United States Patent
Ikehata et al.

(10) Patent No.: US 10,896,987 B2
(45) Date of Patent: Jan. 19, 2021

(54) SEALING SHEET FOR BACK SURFACE OF SOLAR CELL, AND SOLAR CELL MODULE

(71) Applicant: TOYOBO CO., LTD., Osaka (JP)

(72) Inventors: Yoshitomo Ikehata, Tsuruga (JP); Akira Shimizu, Tsuruga (JP); Jun Inagaki, Tsuruga (JP); Shinji Sawasaki, Osaka (JP); Ken Jibiki, Osaka (JP)

(73) Assignee: TOYOBO CO., LTD., Osaka (JP)

( * ) Notice: Subject to any disclaimer, the term of this patent is extended or adjusted under 35 U.S.C. 154(b) by 108 days.

(21) Appl. No.: 14/385,318

(22) PCT Filed: Mar. 11, 2013

(86) PCT No.: PCT/JP2013/056651
§ 371 (c)(1),
(2) Date: Sep. 15, 2014

(87) PCT Pub. No.: WO2013/137196
PCT Pub. Date: Sep. 19, 2013

(65) Prior Publication Data
US 2015/0068601 A1    Mar. 12, 2015

(30) Foreign Application Priority Data

Mar. 14, 2012   (JP) ................................ 2012-057431
Apr. 24, 2012   (JP) ................................ 2012-098546

(51) Int. Cl.
| *H01L 31/049* | (2014.01) |
| *B32B 27/18* | (2006.01) |
| *B32B 27/36* | (2006.01) |
| *B32B 27/08* | (2006.01) |
| *B32B 27/20* | (2006.01) |
| *C08L 67/02* | (2006.01) |

(Continued)

(52) U.S. Cl.
CPC ............ *H01L 31/049* (2014.12); *B32B 27/08* (2013.01); *B32B 27/18* (2013.01); *B32B 27/36* (2013.01); *B32B 27/20* (2013.01); *B32B 2250/02* (2013.01); *B32B 2250/03* (2013.01); *B32B 2250/244* (2013.01); *B32B 2255/10* (2013.01); *B32B 2255/26* (2013.01); *B32B 2264/10* (2013.01); *B32B 2264/102* (2013.01); *B32B 2272/00* (2013.01); *B32B 2307/308* (2013.01); *B32B 2307/40* (2013.01); *B32B 2307/4026* (2013.01); *B32B 2307/416* (2013.01); *B32B 2307/54* (2013.01); *B32B 2307/71* (2013.01); *B32B 2307/712* (2013.01); *B32B 2307/732* (2013.01); *B32B 2307/734* (2013.01); *B32B 2367/00* (2013.01); *B32B 2457/12* (2013.01); *C08K 3/013* (2018.01); *C08K 3/22* (2013.01); *C08K 2003/2241* (2013.01); *C08L 67/02* (2013.01); *C08L 67/03* (2013.01); *C08L 2203/204* (2013.01); *C08L 2207/20* (2013.01); *C09D 175/04* (2013.01); *C09D 175/06* (2013.01); *Y02E 10/50* (2013.01); *Y10T 428/2495* (2015.01); *Y10T 428/24942* (2015.01); *Y10T 428/25* (2015.01); *Y10T 428/256* (2015.01); *Y10T 428/31565* (2015.04); *Y10T 428/31786* (2015.04)

(58) Field of Classification Search
None
See application file for complete search history.

(56) References Cited

U.S. PATENT DOCUMENTS

| 4,370,291 A | * | 1/1983 | Kazama ................. B29C 55/065 |
| | | | 264/210.7 |
| 5,484,632 A | * | 1/1996 | Mercer, Jr. .............. B32B 27/36 |
| | | | 428/35.7 |

(Continued)

FOREIGN PATENT DOCUMENTS

| CN | 101367284 A | * | 2/2009 |
| JP | S57-054290 B | | 11/1982 |

(Continued)

OTHER PUBLICATIONS

Japanese Patent Office, International Search Report in International Patent Application No. PCT/JP2013/056651 (dated Apr. 2, 2013).

(Continued)

*Primary Examiner* — Vivian Chen
(74) *Attorney, Agent, or Firm* — Leydig, Voit & Mayer, Ltd.

(57) ABSTRACT

The present invention is a sealing sheet for a back surface of a solar cell comprising only one polyester film, wherein the polyester film is composed of at least the layer A and the layer B, or the layer A, the layer B and the layer C described below, wherein the polyester film has a given whiteness and a given average reflectance of the polyester film, a given acid value of the polyester, a given thickness of the whole polyester film, a given thickness of the A layer and the B layer, and a given content of the inorganic fine particles in the whole polyester film.

Layer A: a polyester resin layer in which the content of the inorganic fine particles is 10 to 35% by mass Layer B: a polyester resin layer in which the content of the inorganic fine particles is 0 to 8% by mass, which is the smallest among the contents of the inorganic fine particles in the layer A, the layer B and the layer C Layer C: a polyester resin layer in which the content of the inorganic fine particles is 0.4 to 10% by mass.

20 Claims, No Drawings

(51) Int. Cl.
*C08L 67/03* (2006.01)
*C09D 175/06* (2006.01)
*C09D 175/04* (2006.01)
*C08K 3/22* (2006.01)
*C08K 3/013* (2018.01)

(56) References Cited

U.S. PATENT DOCUMENTS

| | | | | |
|---|---|---|---|---|
| 5,510,454 | A * | 4/1996 | Stouffer | C08G 63/80 525/437 |
| 7,872,092 | B2 | 1/2011 | Fujii et al. | |
| 8,197,931 | B2 * | 6/2012 | Ueda | C08J 5/18 428/317.9 |
| 8,339,700 | B2 * | 12/2012 | Watanabe | B32B 25/14 359/359 |
| 8,709,589 | B2 * | 4/2014 | Aoyama | B32B 27/36 428/317.9 |
| 8,912,427 | B2 * | 12/2014 | Ikehata | B32B 27/08 136/251 |
| 9,640,689 | B2 * | 5/2017 | Hamamoto | H01L 31/048 |
| 9,714,349 | B2 * | 7/2017 | Togawa | C09D 5/00 |
| 2004/0084140 | A1 * | 5/2004 | Kobayashi | B29C 65/1635 156/272.8 |
| 2005/0214526 | A1 * | 9/2005 | Klein | B32B 27/36 428/328 |
| 2006/0275593 | A1 * | 12/2006 | Kern | B32B 27/08 428/220 |
| 2008/0107879 | A1 * | 5/2008 | Kliesch | B32B 27/20 428/212 |
| 2008/0216889 | A1 * | 9/2008 | Blong | B32B 27/08 136/251 |
| 2009/0034235 | A1 * | 2/2009 | Kusume | B32B 27/08 362/97.2 |
| 2009/0042016 | A1 * | 2/2009 | Yoshida | B32B 3/26 428/317.9 |
| 2009/0065055 | A1 | 3/2009 | Fujii et al. | |
| 2010/0086736 | A1 * | 4/2010 | Ueda | B32B 27/08 428/141 |
| 2010/0215902 | A1 | 8/2010 | Kiehne et al. | |
| 2010/0229924 | A1 * | 9/2010 | Teranishi | B32B 27/36 136/252 |
| 2010/0285302 | A1 * | 11/2010 | Yoshida | B32B 27/08 428/317.9 |
| 2010/0307570 | A1 * | 12/2010 | Aoyama | C08J 5/18 136/252 |
| 2011/0223419 | A1 * | 9/2011 | Okawara | B32B 27/36 428/355 EN |
| 2011/0305913 | A1 * | 12/2011 | Hinton | B29C 55/065 428/480 |
| 2012/0021197 | A1 | 1/2012 | Matsumura et al. | |
| 2012/0097220 | A1 * | 4/2012 | Miyashita | B32B 27/08 136/251 |
| 2012/0183761 | A1 * | 7/2012 | Hamamoto | C08G 63/826 428/316.6 |
| 2012/0183792 | A1 * | 7/2012 | Mizuno | H01L 31/02167 428/458 |
| 2012/0305078 | A1 * | 12/2012 | Hatakeyama | C08J 7/0427 136/259 |
| 2013/0012665 | A1 * | 1/2013 | Nozawa | C08G 63/85 525/437 |
| 2013/0065063 | A1 * | 3/2013 | Masuda | B32B 27/20 428/423.7 |
| 2013/0108849 | A1 * | 5/2013 | Matsumura | C08J 5/18 428/216 |
| 2013/0112271 | A1 * | 5/2013 | Ikehata | B32B 27/08 136/259 |
| 2013/0130010 | A1 * | 5/2013 | Nozawa | C08G 63/82 428/220 |
| 2013/0139883 | A1 * | 6/2013 | Togawa | C08J 5/18 136/256 |
| 2014/0020749 | A1 * | 1/2014 | Lacrampe | H01L 31/0481 136/256 |
| 2014/0162051 | A1 * | 6/2014 | Jesberger | B32B 27/08 428/327 |
| 2018/0062013 | A1 * | 3/2018 | Nishio | H01L 31/0481 |

FOREIGN PATENT DOCUMENTS

| | | | |
|---|---|---|---|
| JP | H04-028218 B2 | | 5/1992 |
| JP | H11-261085 A | | 9/1999 |
| JP | 2000-114565 A | | 4/2000 |
| JP | 2002-134771 A | | 5/2002 |
| JP | 3567927 B2 | | 6/2004 |
| JP | 3589232 B2 | | 8/2004 |
| JP | 3589233 B2 | | 8/2004 |
| JP | 2004-247390 A | | 9/2004 |
| JP | 2006-270025 A | | 10/2006 |
| JP | 2007-184402 A | | 7/2007 |
| JP | 2007-208179 A | | 8/2007 |
| JP | 2008-085270 A | | 4/2008 |
| JP | 2009-212432 A | * | 9/2009 |
| JP | 2011-097013 A | | 5/2011 |
| JP | 2011-097039 A | | 5/2011 |
| JP | 2011-142128 A | | 7/2011 |
| JP | 2011-249756 A | * | 12/2011 |
| JP | 2012-000972 A | * | 1/2012 |
| JP | 2012-019070 A | | 1/2012 |
| JP | 2012-033967 A | | 2/2012 |
| KR | 10-2011-0118170 A | | 10/2011 |
| WO | WO 2007/105306 A1 | | 9/2007 |
| WO | WO 2010/079798 | * | 7/2010 |
| WO | WO 2010/079798 A | * | 7/2010 |
| WO | WO 2010/113920 A1 | | 10/2010 |
| WO | WO 2010/126088 A | * | 11/2010 |
| WO | WO 2011/040398 | * | 4/2011 |
| WO | WO 2011/068132 A | * | 6/2011 |
| WO | WO 2011/087043 | * | 7/2011 |
| WO | WO 2011/135985 A | * | 11/2011 |
| WO | WO 2012/005034 A | * | 1/2012 |
| WO | WO 2012/005034 A1 | | 1/2012 |
| WO | WO 2012/008488 A1 | | 1/2012 |
| WO | WO 2012/023571 A | * | 2/2012 |
| WO | WO 2011/087043 A | * | 7/2012 |

OTHER PUBLICATIONS

Chinese Patent Office, Notification of the First Office Action in Chinese Patent Application No. 201380013725.8 (dated Oct. 10, 2015).

Taiwan Patent Office, Notification for the Opinion of Examination in Taiwanese Patent Application No. 102108844 (dated Feb. 16, 2015).

European Patent Office, Extended European Search Report in European Patent Application No. 13761677.7 (dated Jul. 8, 2015).

Japanese Patent Office, Notification of Reasons for Rejection in Japanese Patent Application No. 2014-504863 (dated Aug. 16, 2016).

Japanese Patent Office, Submission of Information by Third Parties in Japanese Patent Application No. 2014-504863 (May 25, 2016).

Japanese Patent Office, Notice of Reasons for Rejection in Japanese Patent Application No. 2014-504863 (dated Jan. 31, 2017).

Japanese Patent Office, Decision of Dismissal of Amendment in Japanese Patent Application No. 2014-504863 (dated Jun. 6, 2017).

European Patent Office, Communication Pursuant to Article 94(3) EPC in European Patent Application No. 13761677.7 (dated May 23, 2018).

Korean Intellectual Property Office, Notification of Reason for Refusal in Korean Patent Application No. 10-2014-7026857 (dated Oct. 10, 2018).

Korean Intellectual Property Office, Notice of Final Rejection in Korean Patent Application No. 10-2014-7026857 (dated Apr. 24, 2019).

(56) References Cited

OTHER PUBLICATIONS

Korean Intellectual Property Office, Notice of Final Rejection in Korean Patent Application No. 10-2014-7026857 (dated Jun. 13, 2019).

* cited by examiner

SEALING SHEET FOR BACK SURFACE OF SOLAR CELL, AND SOLAR CELL MODULE

CROSS-REFERENCE TO RELATED APPLICATIONS

This patent application is the U.S. national phase of International Patent Application No. PCT/JP2013/056651, filed Mar. 11, 2013, which claims the benefit of Japanese Patent Application No. 2012-057431, filed on Mar. 14, 2012 and Japanese Patent Application No. 2012-098546, filed on Apr. 24, 2012, which are incorporated by reference in their entireties herein.

TECHNICAL FIELD

The present invention relates to a sealing sheet for a back surface of a solar cell that has high whiteness and good light reflectivity, and is excellent in light resistance and hydrolysis resistance while using only one polyester film, and a solar cell module using the same.

BACKGROUND ART

Recently, solar cells are receiving public attention as a clean energy source of the next generation. In a solar cell module, a component such as a sealing sheet for a back surface which seals the back surface of the solar cell module is used and a film is used for the components thereof. Since a solar cell is used in outside for a long period of time, the components thereof and the film used for the components thereof are required to be durable under natural environment.

As to the sealing sheet for a back surface of a solar cell, there has been used a fluorine film, a polyethylene film or a polyester film to which a white pigment and the like are added, for the purpose of enhancing UV resistance, concealment properties and the like (Patent Documents 1 to 9).

PRIOR ART DOCUMENTS

Patent Documents

Patent Document 1: JP-A-11-261085
Patent Document 2: JP-A-2000-114565
Patent Document 3: JP-A-2004-247390
Patent Document 4: JP-A-2002-134771
Patent Document 5: JP-A-2006-270025
Patent Document 6: JP-A-2007-184402
Patent Document 7: JP-A-2007-208179
Patent Document 8: JP-A-2008-85270
Patent Document 9: WO2007-105306
Patent Document 10: JP-A-2012-19070

SUMMARY OF THE INVENTION

Problems to be Solved by the Invention

As also described in Patent Documents 1 to 9, a white film is used as the component of the sealing sheet for a back surface of a solar cell, whereby it is possible to reflect sunlight and increase power generation efficiency. However, it is necessary to add a large amount of white pigment particles to these white films, and in order to improve dispersibility and mixing state of the particles added in a large amount, a step of preparing a raw material premixed with the particles and a resin, a step such as extending melting time in the normal extrusion step and the like are adopted. As a result of applying such multiple heat histories, the resin is likely to deteriorate, and when the obtained film is used for the sealing sheet for a back surface of a solar cell, there has been a problem that the film is poor in durability under high temperature and high humidity.

Therefore, the film has been always laminated with other film having excellent weather resistance, a barrier film and the like and used as a sealing sheet for a solar cell.

On the other hand, solar power generation is said to be high in cost, and various efforts have been made for reducing power generation cost. Also for the solar cell module, for realizing cost reduction, cost reduction of individual components containing the sealing sheet for a back surface of a solar cell is required. For realizing cost reduction, a sealing sheet for a back surface of a solar cell with a configuration of only one film to be used, not the laminate as described above, is also suggested (Patent Document 10). Such suggested films are not also sufficiently satisfiable as a sealing sheet for a back surface of a solar cell. Also, in the case of seeking further cost reduction, various properties including weather resistance have to be sacrificed, and the appearance of a sealing sheet for a back surface of a solar cell excellent in hydrolysis resistance, adhesiveness and weather resistance (for example, light resistance and the like) at a low cost has been much desired.

In view of the above problems, an object of the present invention is to provide a sealing sheet for a back surface of a solar cell that has high whiteness and good light reflectivity, and is excellent in environmental durability represented by light resistance and hydrolysis resistance, adhesiveness with an encapsulation resin layer such as EVA, and electric insulation, while comprising only one polyester film, and a solar cell module using the same.

Solution to the Problems

The present invention adopts the following means in order to solve the above problem:

(1) A sealing sheet for a back surface of a solar cell comprising only one polyester film, wherein the polyester film is composed of at least the layer A and the layer B, or the layer A, the layer B and the layer C described below, wherein the polyester film has whiteness of 50 or more, an average reflectance of 50 to 95% in the range of a wavelength of 400 to 800 nm, an acid value of polyester constituting the polyester film of 1 to 50 eq/ton, and a thickness of 150 to 380 μm, and a multilayer structure in which the layer A is disposed as at least one outermost layer, the thickness of the layer A is 3 to 30% of the thickness of the whole polyester film, the thickness of the layer B is 20% or more of the thickness of the whole polyester film, and the content of the inorganic fine particles in the whole polyester film is 0.5 to 10% by mass.

Layer A: a polyester resin layer in which the content of the inorganic fine particles is 10 to 35% by mass Layer B: a polyester resin layer in which the content of the inorganic fine particles is 0 to 8% by mass, which is the smallest among the contents of the inorganic fine particles in the layer A, the layer B and the layer C Layer C: a polyester resin layer in which the content of the inorganic fine particles is 0.4 to 10% by mass (2) The sealing sheet for a back surface of a solar cell according to (1), wherein the inorganic fine particles are titanium dioxide mainly consisting of a rutile type.

(3) The sealing sheet for a back surface of a solar cell according to (1) or (2), wherein the thermal shrinkage rate in the longitudinal direction at 150° C. is 0.2 to 3.0%.

(4) The sealing sheet for a back surface of a solar cell according to any one of (1) to (3), wherein the breaking elongation retention after accelerated hydrolysis test in the treatment conditions of 105° C., 100% RH and 0.03 MPa for 200 hours is 60 to 100%.

(5) The sealing sheet for a back surface of a solar cell according to any one of (1) to (4), wherein the breaking elongation retention after accelerated photo degradation test in the irradiation conditions of 63° C., 50% RH and UV irradiation intensity of 100 mW/cm$^2$ for 100 hours is 35% or more.

(6) The sealing sheet for a back surface of a solar cell according to any one of (1) to (5), wherein the change of the color b* value after accelerated photo degradation test in the irradiation conditions of 63° C., 50% RH and UV irradiation intensity of 100 mW/cm$^2$ for 100 hours is 12 or less.

(7) The sealing sheet for a back surface of a solar cell according to any one of (1) to (6), wherein a coating layer containing a polyurethane resin comprising an aliphatic polycarbonate polyol as a constituent is disposed on at least one surface of the polyester film.

(8) The sealing sheet for a back surface of a solar cell according to any one of (1) to (7), wherein the polyester resin constituting the layer B has an intrinsic viscosity of 0.63 to 0.90 dl/g and an acid value of 25 eq/ton or less.

(9) The sealing sheet for a back surface of a solar cell according to any one of (1) to (8), wherein the layer C comprises the recycled polyester resin.

(10) The sealing sheet for a back surface of a solar cell according to any one of (1) to (9), wherein the layer A, the layer B and the layer C are laminated in this order.

(11) The sealing sheet for a back surface of a solar cell according to (10), wherein an easily adhesive layer is disposed in the side of the layer C.

(12) A solar cell module comprising the sealing sheet for a back surface of a solar cell according to any one of (1) to (11), an encapsulation resin layer adjacent to the sealing sheet for a back surface of a solar cell, and a solar cell device embedded in the encapsulation resin layer.

Effects of the Invention

The sealing sheet for a back surface of a solar cell of the present invention has high whiteness and good light reflectivity, and is excellent in environmental durability represented by light resistance and hydrolysis resistance, adhesiveness with the encapsulation resin layer such as EVA, and electric insulation, while it is inexpensive and light in weight, and a solar cell module using the same has high power generation efficiency and is excellent in environmental durability.

MODE FOR CARRYING OUT THE INVENTION

The present invention is a sealing sheet for a back surface of a solar cell comprising only one polyester film, wherein the polyester film is composed of at least the layer A and the layer B, or the layer A, the layer B and the layer C described below, wherein the polyester film has whiteness of 50 or more, an average reflectance of 50 to 95% in the range of a wavelength of 400 to 800 nm, an acid value of polyester constituting the polyester film of 1 to 50 eq/ton (hereinafter referred to as acid value of film), and a thickness of 150 to 380 μm, and a multilayer structure in which the layer A is disposed as at least one outermost layer, the thickness of the layer A is 3 to 30% of the thickness of the whole polyester film, the thickness of the layer B is 20% or more of the thickness of the whole polyester film, and the content of the inorganic fine particles in the whole polyester film is 0.5 to 10% by mass.

Layer A: a polyester resin layer in which the content of the inorganic fine particles is 10 to 35% by mass Layer B: a polyester resin layer in which the content of the inorganic fine particles is 0 to 8% by mass, which is the smallest among the contents of the inorganic fine particles in the layer A, the layer B and the layer C Layer C: a polyester resin layer in which the content of the inorganic fine particles is 0.4 to 10% by mass The sealing sheet for a back surface of a solar cell comprising only one polyester film means a sheet composed of only one polyester film as a material retaining an independent shape, and does not mean those obtained by bonding multiple materials retaining an independent shape such as a film, a sheet-like material, and a metal foil. Incidentally, the polyester film may have a coating layer and a print layer on the surface thereof.

<Polyester Resin>

The polyester resins used for the polyester film used in the present invention is those prepared by polycondensing an aromatic dicarboxylic acid or an ester thereof such as terephthalic acid, isophthalic acid, naphthalene dicarboxylic acid with a glycol such as ethylene glycol, butylene glycol, diethylene glycol, 1,4-butane diol, neopentyl glycol. The polyester resin may be a homopolymer obtained by polymerizing these components or a copolymer obtained by copolymerizing these components with a third component.

A representative example of the polyester resin includes polyethylene terephthalate, polybutylene terephthalate, polyethylene-2,6-naphthalate, and the like.

In the case where the third component is copolymerized, the mol ratio of ethylene terephthalate unit, butylene terephthalate unit or ethylene-2,6-naphthalate unit is preferably 70% by mol or more, more preferably 80% by mol or more, and even preferably 90% by mol or more.

The polyester resin can be manufactured by a method of directly polycondensing an aromatic dicarboxylic acid and a glycol; a method of carrying out ester-changing reaction of an alkyl ester of an aromatic dicarboxylic acid with a glycol, and subsequently polycondensing the resulting product; a method of polycondensing diglycol esters of aromatic dicarboxylic acids and the like.

A polycondensation catalyst includes an antimony compound, a titanium compound, a germanium compound, a tin compound, aluminum and/or aluminum compound, a phosphorus compound having an aromatic ring in a molecular, an aluminum salt of a phosphorus compound, and the like.

The thermal stability of the polyester resin can be further improved by removing the catalyst from the obtained polyester resin after polycondensation or inactivating the catalyst by adding a phosphorus compound and the like. In addition, the multiple catalysts may be contained in appropriate amounts, as long as problems such as properties of the polyester resin, processability, and color are not caused.

When the polyester resin is manufactured, dialkylene glycol is produced as a byproduct at the time of esterification of terephthalic acid or the time of transesterification of dimethyl terephthalic acid. In the case where dialkylene glycol is contained in the polyester resin in a large amount, heat resistance may be lowered when the obtained film is exposed to environment of high temperature. Therefore, it is preferable that the content of dialkylene glycol of the polyester resin used in the present invention is controlled in a given range.

Specifically, in the case of diethylene glycol as a representative dialkylene glycol, the content of diethylene glycol of the polyester resin is preferably 2.3% by mol or less, more preferably 2.0% by mol or less, and even preferably 1.8% by mol or less. When the content of diethylene glycol is less than 2.3% by mol, the heat stability can be improved, so that the increase of an acid value from decomposition at the time of drying or molding can be suppressed. In addition, it is better that the content of diethylene glycol is small and it is produced as a byproduct in the case of the production of the polyester resin. The lower limit of the content of diethylene glycol is practically 1.0% by mol, and more practically 1.2% by mol.

In order to give the polyester film durability in the present invention, the intrinsic viscosity of the polyester resin used as a raw material is preferably 0.65 dl/g or more, more preferably 0.67 dl/g or more, preferably 0.90 dl/g or less, more preferably 0.85 dl/g or less, even preferably 0.8 dl/g or less, especially preferably 0.77 dl/g or less, and most preferably 0.75 dl/g or less. When the intrinsic viscosity of the polyester resin is controlled in the above range, the productivity can be improved and the hydrolysis resistance and heat resistance of the formed film can be heightened. In the case where the intrinsic viscosity is less than 0.65 dl/g, the hydrolysis resistance and heat resistance of the formed film may be lowered. In addition, in the case where the intrinsic viscosity is higher than 0.90 dl/g, the productivity may be lowered, and the acid value may be increased by shearing heat generation during the formation of the film and the like. It is desirable that solid phase polymerization is carried out after polymerization in order to control the intrinsic viscosity of the polyester resin in the above range.

It is important that the acid value of the polyester film for sealing a back surface of a solar cell of the present invention is in the range of from 1 to 50 eq/ton based on polyester. The acid value is preferably 2 eq/ton or more, more preferably 3 eq/ton or more, preferably 40 eq/ton or less, and more preferably 30 eq/ton or less based on polyester. When the acid value is higher than 50 eq/ton, the hydrolysis resistance of the film may be lowered, and early deterioration may be happened.

In order to adjust the acid value of the film in the above range, it is preferable that the acid value of the polyester resin used as the raw material is controlled in a given range. Specifically, the acid value of the polyester resin is preferably less than 50 eq/ton, more preferably 25 eq/ton or less, and even preferably 20 eq/ton or less. In addition, it is preferable that the acid value of the film is small, and the lower limit of the acid value is 0.5 eq/ton in view of the productivity. The acid value of the polyester resin and the film can be determined by a titration method as set forth below.

In addition, the carboxyl terminal of the polyester resin contributing to the acid value has the action for improving hydrolysis by self catalyst action. In order to obtain high hydrolysis resistance as a member for a solar cell, the upper limit of the acid value of the raw material polyester resin is preferably 20 eq/ton, more preferably 15 eq/ton, even preferably 12 eq/ton, and especially preferably 10 eq/ton. In the case where the acid value is more than 20 eq/ton, the acid value of the film may not be lowered. It is preferable that the acid value of the raw material polyester resin is small, and the lower limit of the acid value is particularly not limited. When the polyester resin having extreme lower acid value is used, the acid value can be minus with a titration method as set forth below. From the practical view, the lower limit of the acid value of the raw material polyester resin is 3 eq/ton, and from the view of the economic productivity, the lower limit of the acid value of the raw material polyester resin is 0 eq/ton.

In order to control the acid value of the polyester resin in the above range, polymerization conditions of the resin, specifically, production apparatus factors such as the structure of an esterification reaction apparatus, the composition ratio of a dicarboxylic acid and glycol in a slurry to be supplied to the esterification reaction apparatus, the esterification reaction conditions such as the esterification reaction temperature, the esterification reaction pressure, and the esterification reaction time, and solid-state polymerization conditions and the like may be set appropriately, and it is preferable that solid phase polymerization is carried out after melt polymerization. In addition, it is effective that the water content of polyester tips to be supplied to extruder machine or the temperature of resins in melting step is controlled. Further, it is preferable that a carboxyl to is blocked with an epoxy compound, a carbodiimide compound and the like. In addition, it is preferable that the polymerization is carried out under nitrogen atmosphere, and, if possible, the prevention of contamination of oxygen.

One kind or multiple kinds of additives such as a fluorescent brightening agent, an ultraviolet absorber, an infrared ray-absorbing pigment, a heat stabilizer, a surfactant, an antioxidant, a lubricant such as silica, almina, and talc, a color pigment such as titanium oxide, and barium sulfate can be contained in the polyester resin according to the purpose to be used.

Examples of the antioxidant may include aromatic amine antioxidants and phenolic antioxidants. Examples of the heat stabilizer may include phosphorus heat stabilizers such as phosphoric acid and phosphate ester, sulfur heat stabilizers, and amine heat stabilizers.

<Inorganic Fine Particle>

Examples of the inorganic fine particles used in the polyester film of the present invention is not limited particularly, and can include titanium dioxide, barium sulfate, silica, kaolinite, talc, calcium carbonate, zeolite, alumina, carbon black, zinc oxide, zinc sulfate, and the like. Among these, titanium dioxide and barium sulfate as white pigment are preferable from the view of the improvement of whiteness and productivity, and titanium dioxide is more preferable.

The content of the inorganic fine particle defined in the present invention is the total content of the inorganic fine particles as shown in the above. For example, in the case where silica as a lubricant and titanium dioxide as a white pigment are contained, the content of the inorganic fine particles is the total content of silica and titanium dioxide. Incidentally, the lubricant is generally contained in the amount of about 100 to 200 ppm in some cases.

The average particle diameter of the inorganic fine particles is preferably 0.1 μm or more, more preferably 0.5 μm or more, preferably 3 μm or less, and more preferably 2.5 μm or less. When the average particle diameter of the inorganic fine particles is adjusted in the above range, the whiteness of the film from light scattering effect is improved, and the film can be formed suitably. On the other hand, when the average particle diameter is less than 0.1 μm, the whiteness to be needed in the film cannot be obtained due to insufficient light-scattering effect. In addition, when the average particle diameter is more than 3 µm, the film may be broken during film production, and the film may not be manufactured successfully.

The average particle diameter of the inorganic fine particles in the present invention can be determined by electron microscopy. Concretely, the following method is employed.

Concretely, the inorganic fine particles are observed by a scanning electron microscope, the magnification is properly changed in accordance with the size of the particles, and the obtained photograph is enlarged and copied. Next, regarding 100 or more fine particles selected at random, the outer circumferences of the respective particles are traced. The equivalent circle diameters of particles in the traced images are measured with an image analysis apparatus and the mean value is defined as the average particle diameter.

The solar cell receives the radiation of sunlight for a long period of time at outdoor, and the solar cell is required for resistance to photo-deterioration (light resistance). From the view of the improvement of light resistance, it is preferable that the inorganic fine particles used in the film of the present invention are titanium dioxide mainly consisting of a rutile type.

Mainly two crystal forms of titanium oxide, rutile type and anatase type, are known and the anatase type has considerably high spectral reflectance of ultraviolet rays, whereas the rutile type has high absorbance of ultraviolet rays (low spectral reflectance). The present inventors pay attention to the difference of the spectral properties of the crystal forms of titanium dioxide and consequently improve the light resistance in a polyester film, and can decrease the coloring from light deterioration of the film, by utilizing the ultraviolet absorption performance of the rutile type. Consequently, the more preferable embodiment of the present invention provides a film excellent in light resistance under light irradiation substantially without adding another ultraviolet absorber. Therefore, a problem such as pollution due to bleeding out of the ultraviolet absorber or decrease in adhesion is scarcely caused.

Herein, "mainly" means that the amount of rutile type titanium dioxide in all of the titanium dioxide particles exceeds 50% by mass. Further, the amount of anatase type titanium dioxide in all of the titanium dioxide particles is preferably 10% by mass or lower, more preferably 5% by mass or lower and most preferably 0% by mass. If the content of anatase type titanium dioxide exceeds 10% by mass, the amount of rutile type titanium dioxide is decreased in all of the titanium dioxide particles and thus the ultraviolet absorption performance sometimes becomes insufficient and also since anatase type titanium dioxide has high photocatalytic function, the light resistance tends to be lowered due this function. Rutile type titanium dioxide and anatase type titanium dioxide can be distinguished by x-ray structural diffraction and spectral absorption properties.

Regarding the rutile type titanium dioxide fine particles in the present invention, the surface of the fine particles may be subjected to inorganic treatment with alumina or silica, or to silicon type or alcohol type organic treatment.

(Master Batch)

A conventionally known method for adding inorganic fine particles to a film can be employed and a master-batch method (MB method) of previously mixing a polyester resin and inorganic fine particles by an extruder is preferable in the view of the decrease of the heat history. Further, it is also possible to employ a method of charging a polyester resin which is not previously dried and inorganic fine particles to an extruder and producing MB while removing water or degassing air. Preferably, a method of producing MB using a polyester resin which is previously dried more or less can more suppress increase in the acid value of the polyester resin. In this case, examples to be employed include a method of preparing MB while degassing and a method of preparing MB by using a polyester resin which is sufficiently dried without degassing. Since the adding method of inorganic fine particles to the polyester resin is controlled as shown in the above, the inorganic fine particles are contained in the large amount, while the acid value of the polyester resin can be appropriately kept at lower level, so that the film having high whiteness and spectral reflectance and meeting both light resistance and hydrolysis resistance can be easily obtained.

In the case of producing MB, for example, it is preferable to lower the moisture content for a polyester resin to be charged, by previously drying. As drying condition, drying is carried out preferably at 100 to 200° C. and more preferably at 120 to 180° C. for preferably 1 hour or longer, more preferably 3 hours or longer, and even preferably 6 hours or longer. Accordingly, the polyester resin is dried so sufficiently as to adjust the moisture amount to be preferably 50 ppm or lower and more preferably 30 ppm or lower.

In the case of producing MB while degassing, it is preferable to employ a method of melting a polyester resin at a temperature of 250° C. to 300° C., preferably 270° C. to 280° C., providing one, preferably two or more degassing openings in a preliminary kneader, keeping the inside of a mixing apparatus under reduced pressure by continuously suction-degassing at 0.05 MPa or higher, preferably 0.1 MPa or higher and maintaining decompression in the mixer and the like.

A preliminary mixing method is not particularly limited and a batch method or a uniaxial or biaxial kneading extruder may be employed.

The antioxidant may be added on the preparation of master batch. In addition, the epoxy group containing compound, the oxazoline group containing compound, and the carbodiimide group containing compound having one functionality or two functionalities may be added on the preparation of master batch.

The upper limit of the acid value of the polyester resin in the master batch is preferably 40 eq/ton, more preferably 35 eq/ton, and even preferably 30 eq/ton. In the case where the acid value exceeds the above range, the acid value of the film cannot be lowered. The lower limit of the acid value of the polyester resin in the master batch is preferably 3 eq/ton, more preferably 5 eq/ton, and especially preferably 7 eq/ton from the view of the economic productivity.

The lower limit of the intrinsic viscosity of the polyester resin in the master batch is preferably 0.55 dl/g, more preferably 0.58 dl/g, and even preferably 0.6 dl/g. In the case where the intrinsic viscosity is lower than the above range, the intrinsic viscosity of the polyester resin in the film is lowered, and high weather resistance may not be obtained.

The upper limit of the intrinsic viscosity of the polyester resin in the master batch is preferably 0.9 dl/g, more preferably 0.85 dl/g, even preferably 0.8 dl/g, and especially preferably 0.77 dl/g. In the case where the intrinsic viscosity is more than the above range, the productivity of the master batch economically become difficult, the acid value can be increased due to large heat generation from shearing during the formation of the film.

The method for preparing the master batch, and carrying out solid phase polymerization is also a preferable method for preparing the master batch having small acid value and high intrinsic viscosity. In this case, the original polyester resin for preparing the master batch may be those obtained by melting polymerization, or those obtained by solid phase polymerization. Here, the method for preparing the master batch by solid phase polymerization leads to increase of cost, and as the acid value becomes smaller and the intrinsic viscosity becomes higher, the cost increases. Therefore, it is necessary that the acid value and the intrinsic viscosity of the master batch are adjusted in taking into consideration the balance among the cost and the acid value and the intrinsic viscosity.

(Layer Structure)

The polyester film of the present invention is composed of the A layer and the B layer, or the A layer, the B layer and the C layer as set forth below. It is preferable that the A layer and the B layer, or the A layer, the B layer and the C layer is laminated in this order. In the polyester film used in the present invention, the A layer is disposed as at least one outermost layer. In the case of the sealing sheet for a back surface of a solar cell, the A layer is disposed in the outermost layer opposite to the solar cell (in the backmost face to the solar cell). When the A layer is disposed in the backmost face to the solar cell, ultraviolet-ray which is directly entered from the backside of the solar cell module is effectively cut off in the surface layer, and the added amount of the inorganic fine particles of the whole film can be decreased, so that the back sheet having high light resistance and excellent hydrolysis resistance can be obtained.

The A layer may be disposed in the layer of the solar cell side of the film, and the A layer contains the inorganic fine particle in the large amount, and may be peeled in the interface containing the encapsulation resin layer such as EVA. Therefore, the layer of the solar cell side is preferably either the B layer or the C layer. When the C layer is disposed in the layer of the solar cell side, it is preferable that yellowing due to light entering from the light-receiving side, especially the gaps of the cell can be suppressed. In addition, when the white film is used in the solar cell, the light entering from the gaps of the cell is irregularly reflected in the cell side and the power generation efficiency is increased. Therefore, the B layer is disposed in the layer of the solar cell side, light from more distant source can be easily incorporated, so that the power generation efficiency can be further increased.

Each of the A layer, the B layer, and the C layer is not necessarily formed in one layer, and may be formed in the multiple layers, respectively. Concrete layer structure includes A/B, A/B/A, A/B/C, A/C/B, A/C/B/C, A/B/CB, A/B/A/C, A/C/A/B and the like. The layer structure is preferably A/B, A/B/A, A/B/C, and A/C/B, and most preferably A/B and A/B/C.

<Layer Concentrically Containing Inorganic Fine Particle: A Layer>

In the polyester film used in the present invention, a layer concentrically containing inorganic fine particles, which contains inorganic fine particles in the amount of from 10 to 35% by mass, is disposed as at least one outermost layer. The layer concentrically containing inorganic fine particles (A layer) is a layer in which the content of the inorganic fine particles is most among the A layer, the B layer, and the C layer. In addition, the content of the inorganic fine particles of the layer concentrically containing inorganic fine particles is preferably 11% by mass or more, more preferably 12% by mass or more, and especially preferably 13% by mass or more. The content of the inorganic fine particles of the layer concentrically containing inorganic fine particles is preferably 30% by mass or less, more preferably 28% by mass or less, even preferably 27% by mass or less, even more preferably 25% by mass or less, especially preferably 23% by mass or less, and most preferably 21% by mass or less. When the content of the inorganic fine particles is within the above range, the sealing sheet for a back surface of a solar cell having high whiteness and reflectance, and excellent environmental durability can be obtained. On the other hand, when the content of the inorganic fine particles is less than 10% by mass, whiteness and reflectance of the film is insufficient, so that the light deterioration of the film is easily caused. In addition, when the content of the inorganic fine particles is more than 35% by mass, much heat history is needed to disperse uniformly the particles in the resin, and the problems that the conventional problems cannot be solved and the film-forming properties is lowered are caused in some cases.

The upper limit of the acid value of the polyester resin for constituting the A layer is preferably 50 eq/ton, more preferably 45 eq/ton, even preferably 40 eq/ton, especially preferably 35 eq/ton, and most preferably 30 eq/ton. When the upper limit is more than the above range, hydrolysis resistance is decreased, powder from the surface of the A layer is dropped and crack is caused, and the A layer is peeled in some cases.

The acid value can be adjusted in the above range by using raw materials or master batch having low acid value, and preventing the increase of the acid value during film formation as shown in the above. The lower limit of the acid value of the polyester resin for constituting the A layer is preferably 0 eq/ton, more preferably 2 eq/ton, even preferably 4 eq/ton, especially preferably 5 eq/ton, and most preferably 6 eq/ton. When the acid value is less than the above value, the productivity at practical and lower cost becomes difficult in some cases.

The lower limit of the intrinsic viscosity of the polyester resin for constituting the A layer is preferably 0.60 dl/g, more preferably 0.62 dl/g, even preferably 0.64 dl/g, and especially preferably 0.65 dl/g. When the lower limit is less than the above value, hydrolysis resistance is decreased, powder from the surface of the A layer is dropped crack is caused, and the A layer is separated in some cases. The upper limit of the intrinsic viscosity of the polyester resin for constituting the A layer is preferably 0.9 dl/g, more preferably 0.85 dl/g, even preferably 0.8 dl/g, and especially preferably 0.77 dl/g. When the upper limit of the intrinsic viscosity is more than the above value, the film-forming properties is lowered, the acid value is increased due to the heat generation from knead during film formation, and the productivity at practical and lower cost becomes difficult in some cases. Incidentally, the intrinsic viscosity can be adjusted within the above range by using raw materials and master batches having high intrinsic viscosity, and controlling the degradation at low level during the film formation.

In one embodiment, the polyester film used in the present invention is a laminate having at least two layers, and may be a laminate having three layers or more. The polyester film is constituted such that the layer containing the inorganic fine particles in the large amount (the layer concentrically containing inorganic fine particles) is disposed in the outermost layer in at least one side. For example, in the case where the layer concentrically containing inorganic fine particles is the A layer, and other layer in which the content of the inorganic fine particles is smaller than that of the layer concentrically containing inorganic fine particles is the B layer, layer structure such as the A layer/the B layer, the A layer/the B layer/the A layer can be adopted. Preferable layer structure is a structure of two layers. When the structure of two layers is used as the back sheet, the layer containing the inorganic particles in a large amount is disposed in the outermost layer in the side receiving direct solar light, and the deterioration of the film and the adhesive layer is sufficiently prevented by ultraviolet ray and the like.

The disposed layer for prevention of the deterioration due to ultraviolet ray and the like is needed to add the inorganic fine particles at the high concentration to a certain degree, surface roughness becomes large, and adhesion between layers cannot be obtained easily. As for merit for the structure of two layers, one preferable reason is that the content of the inorganic fine particles can be controlled at lower level in the opposite side, and the above problems are not caused.

In the case of the structure of two layers (for example, the A layer/the B layer) or three layers (for example, the A layer/the B layer/the A layer, the A layer/the B layer/the C layer), the thickness of the skin layer (the A layer) of the outermost layer, that is, the total thickness of the skin layer in one side or both side, to the whole layer of the film is 3 to 30%. The thickness ratio of the skin layer (the A layer) is preferably 4% or more, more preferably 5% or more, and even preferably 6% or more. The thickness ratio of the skin layer (the A layer) is preferably 25% or less, more preferably 20% or less, even preferably 15% or less, and especially preferably 10% or less. When the thickness ratio of the skin layer is adjusted in the above range, the polyester film suitable for the sealing sheet for a back surface of a solar cell meeting whiteness, reflectance, and environmental durability can be obtained. On the other hand, when the thickness ratio of the skin layer is lower than the lower limit as shown in the above, the light deterioration of the film is gradually progressed to thickness direction, and the stable productivity becomes difficult in some cases. In addition, when the thickness ratio of the skin layer is higher than the upper limit as shown in the above, there is a tendency that hydrolysis resistance of the whole film is decreased.

The thickness of the A layer is preferably 5 μm or more, more preferably 6 μm or more, even preferably 7 μm or more, and especially preferably 8 μm or more. When the thickness of the A layer is lower than the above value, shading performance is decreased, the light deterioration of the film is gradually progressed to thickness direction, light resistance is decreased, and the yellow turn is caused in some cases. The thickness of the A layer is not needed to greatly make thickness larger, and the thickness of the A layer is preferably 70 μm or less, more preferably 60 μm or less, even preferably 50 μm or less, and especially preferably 40 μm or less. When the thickness is more than the above value, the effects of the present invention are saturated, economic demerit is caused, and the durability of the whole film is decreased due to thin thickness of the B layer and the C layer.

It is preferable that the polyester film used in the present invention has the structure composed of two layers satisfying the thickness ratio as shown in the above. The light deterioration is gradually progressed from the outermost layer in the side of direct radiation of solar light to thickness direction. Therefore, the layer concentrically containing inorganic fine particles is not separately disposed in many layers, and is disposed as one layer in the outermost layer in the side of direct radiation of solar light, so that functionality for effectively preventing light deterioration can be concentrated on the layer containing inorganic fine particles in a large amount. In addition, in the case where the layer concentrically containing inorganic fine particles is disposed in the intermediate layer, in view of the possibility that the separation of the film is caused due to deterioration of the resin, the layer concentrically containing inorganic fine particles is preferably disposed in the outermost layer in the side of the direct radiation of the solar light, that is, only in the backside which is opposite to the solar cell device. For example, the film of the present invention is constituted by two layers, the content of the inorganic fine particle is concentrated in the outermost layer in the side of direct radiation of the solar light, and the content of the inorganic fine particles of the whole film is controlled in the small amount, so that whiteness, reflectance, anti UV performance, hydrolysis resistance can be satisfied at higher level.

<Other Layer Containing Inorganic Fine Particle in Small Amount>

The polyester film used in the present invention has other layer (the B layer, the C layer) having inorganic fine particles in the amount less than that of the layer concentrically containing inorganic fine particles or without containing inorganic fine particles. The content of inorganic fine particles in the other layer may be small than that in the layer concentrically containing inorganic fine particles. From the above reason, it is preferable that the difference of the content of the inorganic fine particles between the layer concentrically containing inorganic fine particles and other layer is 10% by mass or more.

(Layer without Containing Inorganic Fine Particle or Layer Containing Inorganic Fine Particle in Small Amount: B Layer)

The B layer is a layer which does not contain the inorganic fine particles, or which contain inorganic fine particles in a small amount. Generally, in the case of addition of inorganic fine particles to the film, the master batch is used. However, the productivity of the master batch at economic and lower cost is considered, the acid value is increased and intrinsic viscosity is lowered compared with pellets obtained from polymerization. In addition, in the film formation from extension of the film, there is the case that parts held with clip of the tenter is needed to cut, cut parts are recycled and made in pellet in order to decrease cost, thus obtained materials are mixed with virgin pellet. Thus recycled pellets are found to cause the decrease of hydrolysis resistance of the film, because the pellet has high acid value and lower intrinsic viscosity. The present invention has the feature that the layer in which the factor causing the decrease of the hydrolysis resistance of the film is removed is disposed.

The polyester resin used in the B layer is preferably the polyester resin as mentioned in the above. The B layer may be multiple layers of two layers or more. In this case, it is preferable that the above-mentioned polyester resin is used in at least one layer of the B layer.

Particle used in the B layer may be not only the above-mentioned titanium oxide but also for example, lubricants such as silica, talc, calcium carbonate, colorant particles such as carbon black, iron oxide, pigment. In addition, when the B layer is composed of the multiple layers, the B layer may be a laminate composed of a layer containing inorganic fine particles and a layer without containing inorganic fine particles.

When the B layer is composed of multiple layers, the B layer may be a laminate composed of a polyester resin having different acid value and a polyester resin having different molecular weight.

The B layer is a layer in which the content of inorganic fine particles is most small among the A layer, the B layer, and the C layer. When the content of the inorganic fine particles of the B layer is most small or zero, the hydrolysis resistance of the whole sealing sheet for a back surface of a solar cell can be improved.

The upper limit of the content of inorganic fine particles of the B layer is preferably 8% by mass, more preferably 2% by mass, even preferably 1.5% by mass, even more preferably 1.0% by mass, especially preferably 0.7% by mass, most preferably 0.5% by mass, and especially most preferably 0.39% by mass. When the content is more than the above value, the hydrolysis resistance is decreased in some cases. Preferably, the B layer does not contain inorganic fine particles, and the lower limit of the content of the inorganic fine particles of the B layer is 0% by mass.

The upper limit of the acid value of the polyester resin for constituting the B layer is preferably 25 eq/ton, more preferably 20 eq/ton, even preferably 15 eq/ton, especially preferably 13 eq/ton, and most preferably 11 eq/ton. When the upper limit of the acid value is more than the above value, hydrolysis resistance is decreased, and it is difficult that durability is obtained as a sealing material for a back surface of a solar cell in some cases. The lower limit of the acid value of the polyester resin for constituting the B layer is preferably 0 eq/ton, more preferably 1 eq/ton, even preferably 2 eq/ton, and especially preferably 3 eq/ton in view of economic productivity.

The lower limit of the intrinsic viscosity of the polyester resin for constituting the B layer is preferably 0.63 dl/g, more preferably 0.65 dl/g, even preferably 0.66 dl/g, and especially preferably 0.67 dl/g. When the lower limit of the intrinsic viscosity is less than the above value, it is difficult that durability is obtained as a sealing material for a back surface of a solar cell in some cases.

The upper limit of the intrinsic viscosity of the polyester resin for constituting the B layer is preferably 0.90 dl/g, more preferably 0.85 dl/g, even preferably 0.8 dl/g, especially preferably 0.77 dl/g, and most preferably 0.75 dl/g. When the upper limit of the intrinsic viscosity is more than the above value, the film forming properties may be lowered, the acid value may be increased by shear heating during melting knead.

The acid value and intrinsic viscosity can be adjusted in the above range by using a raw material having lower acid value and high intrinsic viscosity, and controlling the degradation at the lower level during the film formation.

In addition, it is possible that the master batch and recycled resin are used in the B layer, and it is necessary that the amount of the master batch and recycled resin is controlled in order to keep the above preferable range.

The lower limit of the thickness of the B layer is preferably 50 μm, more preferably 60 μm, and even preferably 70 μm. When the lower limit of the thickness of the B layer is less than the above value, the durability of the whole film can be lowered. It is not necessary that the B layer greatly becomes thicker, and the upper limit of the thickness of the B layer is preferably 350 μm, more preferably 220 μm, even preferably 200 μm, even more preferably 180 μm, and especially preferably 160 μm.

The lower limit of the ratio of the thickness of the B layer to the thickness of the whole film is preferably 20%, more preferably 23%, even preferably 25%, especially preferably 28%, and most preferably 30%. When the lower limit of the ratio of the thickness of the B layer to the thickness of the whole film is less than the above value, the durability of the whole film can be lowered. The upper limit of the ratio of the thickness of the B layer to the thickness of the whole film is preferably 97%, more preferably 70%, even preferably 65%, even more preferably 60%, especially preferably 55%, and most preferably 50%.

(Layer Containing Inorganic Fine Particle in Small Amount: C Layer)

The C layer is a layer in which the inorganic fine particles are contained in a small amount. The lower limit of the content of the inorganic fine particles of the C layer is preferably 0.4% by mass, more preferably 0.6% by mass, even preferably 0.8% by mass, and especially preferably 1% by mass. The upper limit of the content of the inorganic fine particles of the C layer is preferably 10% by mass, more preferably 8% by mass, even preferably 6% by mass, and especially preferably 5% by mass. When the value of the lower limit is less than the above value, yellow coloring is caused in the case where the C layer is used as the layer in the side of the solar cell, and power generation efficiency is decreased in some cases. When the content of the inorganic fine particles of the C layer is more than the above value, adhesiveness can be decreased and the C layer can be separated during use of long period of time.

The upper limit of the acid value of the polyester resin for constituting the C layer is preferably 40 eq/ton, more preferably 30 eq/ton, even preferably 25 eq/ton, especially preferably 20 eq/ton, and most preferably 15 eq/ton. When the value of the upper limit of the acid value is more than the above value, hydrolysis resistance is lowered, barrier property from the edge is decreased due to crack after use of long period of time, and the separation of the C layer is caused in some cases.

The lower limit of the acid value of the polyester resin for constituting the C layer is preferably lower, and is not particularly limited. The lower limit of the acid value of the polyester resin for constituting the C layer is preferably 0 eq/ton, more preferably 2 eq/ton, even preferably 4 eq/ton, and especially preferably 5 eq/ton in view of economic productivity.

The lower limit of the intrinsic viscosity of the polyester resin for constituting the C layer is preferably 0.6 dl/g, more preferably 0.62 dl/g, even preferably 0.63 dl/g, and especially preferably 0.65 dl/g. When the lower limit of the intrinsic viscosity is less than the above range, weather resistance is lowered due to the decrease of the mechanical strength, barrier property from the edge is decreased due to crack after use of long period of time, and the separation of the C layer is caused in some cases.

The upper limit of the intrinsic viscosity of the polyester resin for constituting the C layer is preferably 0.85 dl/g, more preferably 0.8 dl/g, even preferably 0.77 dl/g, and especially preferably 0.75 dl/g. When the upper limit of the intrinsic viscosity is more than the above value, the film forming properties is lowered, and the acid value is increased by large heat generation of melting during film formation.

The acid value and intrinsic viscosity can be adjusted in the above range by using a raw material having lower acid value and high intrinsic viscosity, and controlling the degradation at the lower level during the film formation.

In addition, use of the recycled polyester resin in the C layer is preferable embodiment in order to introduce white pigment. Incidentally, in the case of use of the recycled polyester resin, it is preferable to use the sufficiently dried polyester resin in order to suppress the increase of the acid value and the decrease of the intrinsic viscosity. Also, it is preferable to dry the polyester resin in the case of re-pelletization after melting.

The lower limit of the thickness of the C layer is preferably 50 μm, more preferably 60 μm, and even preferably 70 μm. The upper limit of the thickness of the C layer is preferably 220 µm, more preferably 200 µm, even preferably 180 µm, and especially preferably 160 µm.

The lower limit of the ratio of the thickness of the C layer to the thickness of the whole film is preferably 20%, more preferably 23%, even preferably 25%, especially preferably 28%, and most preferably 30%. The upper limit of the ratio of the thickness of the C layer to the thickness of the whole film is preferably 70%, more preferably 65%, even preferably 60%, especially preferably 55%, and most preferably 50%.

It is preferable that the intrinsic viscosity of the polyester resin of the C layer is lower than the intrinsic viscosity of the polyester resin of the B layer. The upper limit of the difference of the intrinsic viscosity of the polyester resin between the B layer and the C layer is preferably 0.1 dl/g, more preferably 0.08 dl/g, even preferably 0.06 dl/g, and especially preferably 0.05 dl/g. When the upper limit of the difference of the intrinsic viscosity of the polyester resin between the B layer and the C layer is more than the above value, the C layer has much decreased weather resistance while the B layer has high weather resistance, the balance of the whole film is not good, so that weather resistance and barrier property are decreased and the separation is caused in some cases. The lower limit of the difference of the intrinsic viscosity of the polyester resin between the B layer and the C layer is preferably 0.01 dl/g, more preferably 0.02 dl/g. It is preferable that the intrinsic viscosity of the polyester resin of the B layer is higher than the intrinsic viscosity of the polyester resin of the A layer. The upper limit of the difference of the intrinsic viscosity of the polyester resin between the A layer and the B layer is preferably 0.1 dl/g, more preferably 0.08 dl/g, even preferably 0.07 dl/g, and the lower limit of the difference of the intrinsic viscosity of the polyester resin between the A layer and the B layer is preferably 0.02 dl/g. The intrinsic viscosity of the polyester resin is preferably the B layer>the C layer>the A layer.

It is preferable that the acid value of the polyester resin of the C layer is higher than the acid value of the polyester resin of the B layer. The upper limit of the difference of the acid value of the polyester resin between the B layer and the C layer is preferably 10 eq/ton, more preferably 7 eq/ton, even preferably 5 eq/ton, and especially preferably 4 eq/ton. When the upper limit of the difference of the acid value of the polyester resin between the B layer and the C layer is more than the above value, the C layer has much decreased weather resistance while the B layer has high weather resistance, the balance of the whole film is not good, so that weather resistance and barrier property are decreased and the separation is caused in some cases. The lower limit of the difference of the acid value of the polyester resin between the B layer and the C layer is preferably 1 eq/ton, and more preferably 2 eq/ton. It is preferable that the acid value of the polyester resin of the A layer is higher than the acid value of the polyester resin of the B layer. The upper limit of the difference of the acid value of the polyester resin between the A layer and the B layer is preferably 20 eq/ton, more preferably 15 eq/ton, and the lower limit of the difference of the acid value of the polyester resin between the A layer and the B layer is preferably 1 eq/ton, and more preferably 2 eq/ton. When the upper limit of the difference of the acid value of the polyester resin between the A layer and the B layer is more than the above value, the A layer has much decreased weather resistance while the B layer has high weather resistance, the balance of the whole film is not good, so that weather resistance is decreased and the crack and separation of the surface is caused in some cases. When the lower limit of the difference of the acid value of the polyester resin between the A layer and the B layer is less than the above value, the preparation of the master batch becomes difficult, and the economic productivity and the productivity of consistent quality become difficult in some cases. The acid value of the polyester resin is preferably the B layer<the C layer<the A layer.

In the present invention, it is preferable that the intrinsic viscosity and acid value of each layer are adjusted in the above range according to the required weather resistance.

<Function Imparting Layer>

In the sealing sheet for a back surface of a solar cell of the present invention, when various functions such as easy adhesiveness, abrasion resistance, stain-proofing properties and barrier properties are required to the polyester film, the surface may be coated with a polymer resin by coating or the like. Also, when slipperiness is required, the coating layer may contain inorganic and/or organic particles.

When easy adhesiveness is required, it is preferred to dispose a coating layer using an aqueous coating liquid containing at least one of a water-soluble or water-dispersible copolyester resin, acrylic resin and polyurethane resin, on at least one surface of the film (for example, when constituted of the layer A and the layer B, the layer B; when constituted of the layer A, the layer B and the layer C, the layer C). Examples of the coating liquid include aqueous coating liquids disclosed in JP 3567927 B1, JP 3589232 B1, JP 3589233 B1, and the like.

In particular, in the sealing sheet for a back surface of a solar cell of the present invention, for exhibiting easy adhesion to the encapsulation resin layer, it is preferred to dispose an easily adhesive layer, on the surface in contact with the encapsulation resin layer of an olefin resin such as an ethylene-vinyl acetate copolymer (EVA) or polyvinyl butyral (PVB). It is preferred to apply one obtained by adding a polyester resin or a polyurethane resin to an aqueous coating liquid as an easily adhesive layer, and among them, it is preferred to add a polyurethane resin containing an aliphatic polycarbonate polyol as a constituent, in terms of excellent heat resistance and hydrolysis resistance and prevention of yellowing with sunlight. Such polyurethane resin is added, whereby adhesion under moist heat conditions can be improved.

Examples of the aliphatic polycarbonate polyol include aliphatic polycarbonate diols, aliphatic polycarbonate triols and the like, and the number average molecular weight of the aliphatic polycarbonate diol is preferably from 1500 to 4000, and more preferably from 2000 to 3000. When the number average molecular weight of the aliphatic polycarbonate diol is less than 1500, a strong and hard urethane component increases, and stress due to the thermal shrinkage of the substrate cannot be relaxed, whereby there may be the case where its adhesion lowers. Also, when the number average molecular weight of the aliphatic polycarbonate diol exceeds 4000, there may be the case where its adhesion and strength after high temperature and high humidity treatment lower.

The molar ratio of the aliphatic polycarbonate polyol is preferably 3% by mol or more and more preferably 5% by mol or more, and preferably 60% by mol or less and more preferably 40% by mol or less, in case where the total polyisocyanate component of the urethane resin is 100% by mol. When the molar ratio is less than 3% by mol, there may be the case where dispersibility in water becomes poor. When the molar ratio exceeds 60% by mol, water resistance lowers, thus moist heat resistance lowers.

The glass transition temperature of the polyurethane resin is not particularly limited, and is preferably lower than 0° C.

and more preferably lower than −5° C. Accordingly, the viscosity of the polyurethane resin becomes close to the viscosity of the partially melted olefin resin such as EVA or PVB upon adhesion with pressure, whereby adhesion is improved due to partial mixing, and preferable softness is likely to be exhibited.

In addition, a coating having various functions such as abrasion resistance, stain-proofing properties and barrier properties can be provided on a surface opposite to the surface in contact with the encapsulation resin layer. The abrasion resistant coating typically includes an acrylic hard coating. The stain-proof coating includes fluorine coating and titanium oxide containing coating. The barrier coating includes PVDC coating and inorganic layered compound-containing coating. As a base of these coating, the easily adhesive coating described above may be provided on the polyester film.

<Method for Producing Polyester Film>

The method for producing a polyester film used in the present invention is not particularly limited, but a co-extrusion method including feeding a polyester chip for forming each layer to a separate extruder, then laminating it in a melted state and extruding it from the same die is preferred. For example, when a two-layer film containing a layer concentrically containing inorganic fine particles is produced, a polyester chip containing much inorganic fine particles (resin chip for the layer concentrically containing inorganic fine particles) and a polyester chip containing less inorganic fine particles (resin chip for other layers) are fed to a separate extruder, or resin chips that are matched to the compositions of the layer A, the layer B and the layer C are respectively blended, and fed to a separate extruder, then may be laminated in a melted state and extruded from the same die.

The melted resin extruded in a sheet form is taken off with a cooling roll to form an unstretched film.

In order to achieve the present invention, it is necessary to reduce the decrease in the intrinsic viscosity and the increase in the acid value as much as possible, during film formation.

For this reason, it is also effective to control the water content of the polyester chip to be fed to the extruder, and to control the resin temperature in the melting step. Furthermore, sealing the carboxyl terminus by an epoxy compound, a carbodiimide compound or the like is also a preferred method.

For example, in order to suppress the increase in the acid value when feeding a polyester chip to the extruder, it is preferred to use a sufficiently dried polyester chip. Specifically, the water content of the polyester chip is preferably 100 ppm or less, more preferably 50 ppm or less, and further preferably 30 ppm or less.

As the method of drying the polyester chip, a known method such as drying under reduced pressure and drying by heating can be used. For example, in the case of drying by heating, the heating temperature is preferably 100 to 200° C. and more preferably 120 to 180° C. The drying time is preferably 1 hour or more, more preferably 3 hours or more, and further preferably 6 hours or more.

In addition, in order to suppress the acid value of the polyester resin, it is also effective to control the resin temperature in the melting step into a certain range. Specifically, the melting temperature of the polyester chip in the extruder is preferably 280 to 310° C. and more preferably 290 to 300° C. The back pressure on the filtration in the extruder reduces by raising the melting temperature, and good productivity can be exhibited. However, in a melting temperature higher than 310° C., thermal degradation of the resin progresses, and the acid value of the resin increases, thus there may be the case where hydrolysis resistance of the obtained film lowers.

Subsequently, the polyester resin for forming each layer melted with the separate extruder is laminated in a melted state, extruded in a sheet form from the same die, and taken off with a cooling roll to form an unstretched film.

The obtained unstretched film is stretched by a biaxial orientation processing. The stretching method includes a sequential biaxially stretching method including heating the obtained unstretched film with a heating roll or a non-contact heater, then stretching it between rolls with different speed (roll stretch), subsequently holding both ends of the film uniaxially stretched with clips, and heating it in an oven, then stretching it in a width direction (tenter stretch), and further heat fixing it by applying high heat, and a simultaneous biaxially stretching method including stretching the obtained unstretched film with a tenter having a mechanism capable of longitudinally and transversely stretching it at the same time (tenter simultaneous biaxial stretch), an inflation stretching method including stretching the obtained unstretched film by expanding it by air pressure, and the like. In these stretching steps, in order to suitably retain elongation at break of the obtained film, it is preferred to keep the balance of longitudinal and transverse orientations by properly controlling longitudinal and transverse stretch ratio.

When a highly dimensional stability against heating is demanded, it is desirable to apply a longitudinal relaxation treatment to the film. As a method for the longitudinal relaxation treatment, known methods, for example, a method where a longitudinal relaxation treatment is conducted by making the space between the clips of the tenter gradually narrow (JP-A-4-028218), a method where a longitudinal relaxation treatment is conducted by avoiding the influence of the clips by means of cutting the edge of the film using a razor in the tenter (JP-A-57-54290), and the like can be exemplified. Also, a method where off-line heat is applied to relax may be used. Furthermore, in the above stretching step, it is possible to impart a highly dimensional stability against heating to the film by properly controlling the stretching conditions.

In order to impart various functions to the film, it is also possible to coat the surface of the film with a polymer resin by coating or the like, and add inorganic and/or organic particles to the coating layer. The imparting method is not particularly limited, and for example, when a coating layer for imparting easy adhesion and the like is formed, a coating layer may be provided after the film formation (off-line coating method), and may be provided during the film formation (in-line coating method). In terms of productivity, it is preferred to provide a coating layer during the film formation.

<Characteristics of Polyester Film for Sealing Back Surface of Solar Cell>

The lower limit of the content of the inorganic fine particles in the whole polyester film used in the present invention is preferably 0.5% by mass, more preferably 0.6% by mass, further preferably 0.7% by mass, further more preferably 0.8% by mass, even further more preferably 0.9% by mass, and particularly preferably 1% by mass. In a content of less than the above, there may be the case where light resistance lowers. The upper limit of the content of the inorganic fine particles is preferably 10% by mass, more preferably 8% by mass, further preferably 7% by mass, further more preferably 6% by mass, and particularly preferably 5% by mass. In a content exceeding the above, hydrolysis resistance of the whole film lowers, and there may be the case where the sealing sheet for a back surface breaks during long-term use.

The upper limit of the acid value in the whole polyester film used in the present invention is preferably 50 eq/ton, more preferably 40 eq/ton, further preferably 30 eq/ton, further more preferably 25 eq/ton, particularly preferably 20 eq/ton, and most preferably 18 eq/ton. In an acid value exceeding the above, there may be the case where hydrolysis resistance lowers. The acid value is preferably low, and in terms of practical productivity, the lower limit is preferably 0 eq/ton, more preferably 1 eq/ton, further preferably 2 eq/ton, particularly preferably 3 eq/ton, and most preferably 4 eq/ton.

The lower limit of the intrinsic viscosity in the whole polyester film used in the present invention is preferably 0.62 dl/g, more preferably 0.64 dl/g, further preferably 0.65 dl/g, and particularly preferably 0.66 dl/g. In an intrinsic viscosity of less than the above, there may be the case where hydrolysis resistance lowers. The upper limit of the intrinsic viscosity is preferably 0.88 dl/g, more preferably 0.83 dl/g, further preferably 0.78 dl/g, and particularly preferably 0.76 dl/g. In an intrinsic viscosity exceeding the above, there may be the case where film-forming properties lower, or shear heat generation during film formation increases, and the acid value increases.

The thickness (excluding the coating layer) of the polyester film for sealing a back surface of a solar cell is set to 150 to 380 μm. The thickness is preferably 180 μm or more, and more preferably 200 μm or more. Also, the thickness is preferably 350 μm or less, and more preferably 330 μm or less. The thickness of the film is controlled to the above range, whereby the film is excellent in electric insulation and is also easy to be made lightweight and thin. On the other hand, when the thickness of the film is larger than 380 μm, not only cost increase is caused, but also the rigidity of the film becomes too high to deteriorate handleability, and it is unlikely to make the film lightweight and thin. Also, when the thickness is less than 150 μm, the film is unlikely to exhibit an electric insulation effect and barrier properties.

The polyester film used in the present invention has whiteness of 50 or more and preferably 60 or more. In whiteness less than 50, concealment properties may be inferior.

Here, the sealing sheet for a back surface of a solar cell of the present invention also has whiteness of 50 or more and preferably 60 or more. The whiteness can be determined according to, for example, JIS L 1015-1981-B.

The polyester film used in the present invention has an average reflectance of 50% or more and preferably 60% or more, in the range of a wavelength of 400 to 800 nm. In addition, the average reflectance is preferably high, but the upper limit is practically 95% or so. When the reflectance is less than 50%, it is not preferred since degradation of the film itself and a member inside the solar cell due to light increases.

Here, it is preferred that the sealing sheet for a back surface of a solar cell of the present invention also has an average reflectance of 50% or more and further 60% or more, in the range of a wavelength of 400 to 800 nm. The average reflectance is, for example, a reflectance when the reflectance of a standard white plate using an integrating sphere in a spectrophotometer is taken as 100%.

The polyester film used in the present invention has a variation of the light reflectance of preferably 5% or less and more preferably 3% or less. In order to reduce the variation of the light reflectance, it is preferred to make the dispersion of inorganic fine particles present in the layer A uniform.

The variation of the light reflectance can be evaluated by the following method, and the smaller value is preferable since the variation of the average light reflectance of the film becomes small. In the resulting film roll, the start and end of roll winding are defined as 0% and 100%, respectively, and a film piece of 1 m×1.8 m is cut out from the central area at each of the length positions 10%, 50% and 90%. Five film samples in 20 cm squares are sampled from four corners and the center of each film piece, and the average reflectance of each sample is measured. The mean value of the average reflectances in each film sample is defined as a central value, and the value obtained after dividing the difference between the maximum and the minimum values of the average reflectance by the central value is defined as the variation of the light reflectance.

The film used in the present invention in the above configuration can exhibit excellent light resistance even under light irradiation, and consequently, the sealing sheet for a back surface of a solar cell of the present invention also exhibits excellent weather resistance. Specifically, when subjected to UV irradiation at 63° C., 50% RH, and irradiation intensity of 100 mW/cm$^2$, for 100 hours, the breaking elongation retention of the sealing sheet for a back surface of a solar cell can be preferably maintained at 35% or more and more preferably 40% or more. As described above, photolysis and degradation of the sealing sheet for a back surface of a solar cell of the present invention are also suppressed by light irradiation, thus it is suitable as a sealing sheet for a back surface of a solar cell used in outside.

The thermal shrinkage rate of the sealing sheet for a back surface of a solar cell of the present invention at 150° C. is preferably 0.2% or more and more preferably 0.4% or more, and preferably 3.0% or less and more preferably 1.8% or less, in the longitudinal direction. Accordingly, thermal shrinkage in processing a solar cell module is suppressed. On the other hand, in a thermal shrinkage rate of less than 0.2%, there may be the case where the sheet bends in processing. Also, when the thermal shrinkage rate is more than 3.0%, shrinkage in processing is large, thus there may be the case where the end of the solar cell module is not completely covered, and shrinkage becomes a residual strain and causes peel-off and crack during long-term use. A method of controlling the thermal shrinkage rate at 150° C. in the above range can be carried out by controlling conditions for stretching the film, or applying to the film a longitudinal relaxation treatment and transverse relaxation treatment in the heat fixing step.

In the polyester film used in the present invention, it is preferred to keep the balance of longitudinal and transverse orientations. More specifically, the MOR value converted to the case where the film thickness is 50 μm (MOR-C) is preferably 1.0 or more and more preferably 1.3 or more, and preferably 2.0 or less and more preferably 1.8 or less. Accordingly, the balance of longitudinal and transverse orientations of the film is adjusted, and mechanical strength and durability are likely to be maintained. Also, generation of strain in processing is suppressed, and adhesion is also improved. A method of controlling MOR-C in the above range can be carried out by controlling longitudinal and transverse stretch ratio in the stretching step of the film. The MOR value can be measured, for example, using a microwave transmission molecular orientation meter.

The sealing sheet for a back surface of a solar cell of the present invention can exhibit high hydrolysis resistance durable for the long-time use in outside. Specifically, as the evaluation index of hydrolysis resistance, the breaking elongation retention of the film after accelerated hydrolysis test (treatment at 105° C., 100% RH, 0.03 MPa, for 200 hours) can be maintained to preferably 50% or more, more preferably 60% or more, and further preferably 70% or more, and especially preferably 100% or less. The breaking elongation retention can be measured according to, for example, JIS C 2318-1997 5.3.31.

Since photolysis and degradation are suppressed even under light irradiation, the sealing sheet for a back surface of a solar cell of the present invention can exhibit excellent light resistance durable for the long-time use in outside. Specifically, as the evaluation index of light resistance, the breaking elongation retention of the film after accelerated photo degradation test (irradiation at 63° C., 50% RH and UV irradiation intensity of 100 mW/cm$^2$ for 100 hours) can be maintained to preferably 35% or more, more preferably 40% or more, and further preferably 60% or more.

The change of the color b* value after the accelerated photo degradation test of the sealing sheet for a back surface of a solar cell of the present invention is preferably 12 or less, more preferably 10 or less, further preferably 8 or less, and particularly preferably less than 5. When the change of the color b* value is larger than 12, it is not preferred since appearance deteriorates due to secular change. The b* value can be measured according to, for example, JIS K 7105-1981 5.3.5(a).

The partial discharge voltage of the sealing sheet for a back surface of a solar cell of the present invention is preferably 800 eV or more, further preferably 1000 eV or more, and particularly preferably 1100 eV or more. The partial discharge voltage can be increased by increasing the thickness of the polyester film. In addition, since the partial discharge voltage may lower due to the effect of precipitated particles derived from a catalyst of the polyester film, it is effective to suppress precipitation of the particles by adjusting catalyst species, catalyst amount, addition timing and conditions in producing polyester, and also to remove particles by passing the melted resin through a filter, for increasing the partial discharge voltage.

The upper limit of the partial discharge voltage is 2000 eV and further 1600 eV or so, based on the relation of the upper limit of the thickness of the film.

The water vapor permeability of the sealing sheet for a back surface of a solar cell of the present invention is preferably 7 g/m$^2$/d or less. The water vapor permeability is further preferably 5 g/m$^2$/d or less and particularly preferably 3 g/m$^2$/d or less. The water vapor permeability can be lowered by increasing the thickness of the polyester film, and also lowered by providing a barrier coating. The lower limit of the water vapor permeability is not particularly set, and is 0.01 g/m$^2$/d or so as a practical value. The water vapor permeability can be measured according to, for example, JIS K 7129 B.

<Sealing Sheet for Back Surface of Solar Cell>

As described above, the sealing sheet for a back surface of a solar cell of the present invention satisfies both environmental durability represented by light resistance and hydrolysis resistance, and whiteness and light reflectivity while comprising one polyester film, and exhibits excellent electric insulation. Thus, it is possible to achieve characteristics of the conventional laminate of a durable layer (hydrolysis resistant layer), a white layer and an insulation layer and the like, by one polyester film. Therefore, by using the sealing sheet for a back surface of a solar cell of the present invention, the film can be made lightweight and thin.

<Solar Cell Module>

The solar cell module in the present invention refers to a system where incident light such as sunlight or room light is received and converted into electricity, and the electricity is stored, and comprises the sealing sheet for a back surface of a solar cell, a encapsulation resin layer adjacent to the sealing sheet for a back surface of a solar cell, and a solar cell device embedded in the encapsulation resin layer. In addition, the solar cell module may comprise a transparent member on the light receiving surface side. The solar cell device includes crystalline silicon type, amorphous silicon type, hybrid type combining crystalline silicon and amorphous silicon, compound type, dye-sensitized type, organic thin film type, and the like. The solar cell device is not particularly limited, and among them, silicon type devices such as crystalline silicon type, amorphous silicon type and hybrid type are strong against deterioration due to water and oxygen, thus are preferable subjects for using the sealing sheet for a back surface of a solar cell of the present invention. The sealing sheet for a back surface of a solar cell of the present invention is particularly preferably used in a crystalline silicon type device. As the crystalline silicon type, it can preferably adapt to both monocrystalline and polycrystalline types.

The resin used in the encapsulation resin layer is not particularly limited, olefin resins such as EVA and PVB can be exemplified.

As a member on the light receiving side, glass, a transparent resin sheet, a transparent resin film or the like is used.

Incidentally, the solar cell module of the present invention may contain a surface protecting sheet, a high transmission material for light and the like, and a material with flexible properties is also used depending on usage.

This application claims the benefit of priority to Japanese Patent Application No. 2012-057431, filed on Mar. 14, 2012 and Japanese Patent Application No. 2012-098546, filed on Apr. 24, 2012. The entire contents of the specifications of Japanese Patent Application No. 2012-057431, filed on Mar. 14, 2012 and Japanese Patent Application No. 2012-098546, filed on Apr. 24, 2012, are incorporated herein by reference.

EXAMPLES

Next, the present invention will be described in detail with reference to Examples and Comparative Examples, but the present invention is not limited thereto, and the variation and the modification of the present invention without departing the gist described above and below are all included the technical scope of the present invention. The measurement and evaluation methods employed in the present invention are described as follows.

<Average Particle Diameter of Inorganic Fine Particles>

The inorganic fine particles were observed under a scanning electron microscope, and photographs were taken after appropriately changing magnification depending on the size of the particles. The photographs taken were enlarged and copied, and as to at least 100 fine particles selected randomly, the outer circumference of each particle was traced. Diameters corresponding to the circles of the particles were measured from the traced images using an image analyzer, and the mean value thereof was adopted as an average particle size.

(Content of Inorganic Fine Particles)

The sample was dissolved in a 6/4 (mass ratio) mixed solvent of phenol/1,1,2,2-tetrachloroethane, then filtered with a Teflon (registered trademark) membrane filter with a pore diameter of 0.2 μm, and washed with the mixed solvent.

The filtrate together with a filter was dried with a vacuum dryer, and the weight of the filtrate was calculated as the weight of inorganic fine particles.

(Layer Thickness and Film Thickness)

The film was embedded in an epoxy resin, and cut perpendicularly to the film, and the cross section was measured by an optical microscope. The thickness of each layer was measured with a vernier caliper by taking photographs or measured from projection images. Here, samples were prepared by collecting five points changing the location so as not to be biased, and the layer thickness was each measured. The mean value thereof was defined as the thickness of each layer. The film thickness was calculated by excluding the thickness of the coating layer.

(Sampling for Measurement of Intrinsic Viscosity and Acid Value)

Whole film: when the coating layer was present on the surface, a film in which the coating layer was removed with a knife or sandpaper was used, Layer A: when the coating layer was present on the surface, the coating layer was removed with a knife or sandpaper, then the layer A portion was scraped off with a knife, and the scraped portion was used as a measurement sample.

Layer B: The film was fixed on a flat board, and the surface was removed with a sandpaper from the layer A side until the layer B was exposed. Here, whether or not the layer B was exposed was confirmed visually or by a film thickness meter. After exposing the layer B on one side, the film was turned over, and the surface was removed with a sandpaper until the layer B was exposed in the same manner. The resulting portion of the layer B only was used as a measurement sample.

Layer C: First, when the coating layer was present in the surface in the layer C side, the coating layer was removed with a knife or sandpaper. The film was fixed on a flat board with the layer C downward, and the surface was removed with a sandpaper from the layer A side until the layer C was exposed. Here, whether or not the layer C was exposed was confirmed visually or by a film thickness meter. The resulting portion of the layer C only was used as a measurement sample. Here, when the layer C was thin and it is hard to take this method, after removing the coating layer of the layer C, the layer C portion was scraped off with a knife, and the scraped portion was used as a measurement sample.

<Intrinsic Viscosity (IV) of Polyester>

The intrinsic viscosity was measured at 30° C. after the polyester was dissolved in mixture solvent of phenol/1,1,2, 2-tetrachloroethane in mass ratio of 6/4. In case of the master batch and film containing inorganic fine particles, the intrinsic viscosity was measured after solid content was removed with centrifugation.

<Content of Diethylene Glycol (DEG)>

After 0.1 g of each polyester was heated and decomposed at 250° C. in 2 ml of methanol, quantitative analysis was carried out by gas chromatography to determine the content of diethylene glycol.

<Acid Value>

The acid value of a film and a raw material polyester resin was measured with the following method. Incidentally, in the case of the polyester resin, chips were sampled as it was, and in the case of the sealing sheet of a back surface of a solar cell, the coating layer was scraped off with a knife, and the scraped portion was used as a measurement sample.

(1) Preparation of Sample

A sample was crushed and vacuum-dried at 70° C. for 24 hours, and thereafter weight in a range of 0.20±0.0005 g with a balance. The mass at that time was defined as W (g).

To a test tube were added 10 ml of benzyl alcohol and the weighed each sample, and the test tube was immersed in a benzyl alcohol heated to 205° C. and the sample was dissolved while being stirred with a glass rod. Samples obtained by adjusting the dissolution time to be 3 minutes, 5 minutes, and 7 minutes were denoted respectively as A, B and C. Next, new tubes were made available and only benzyl alcohol was loaded thereto and subjected to the treatment in the same procedure and samples obtained by adjusting the dissolution time to be 3 minutes, 5 minutes, and 7 minutes were denoted respectively, as a, b, and c. Incidentally, in the case where the sample contained the inorganic fine particles, the mass excluding the mass of the inorganic fine particles was defined as W (g). The content of the inorganic fine particles was calculated by dissolving the sample in a solvent, collecting the solid content by centrifugation, and measuring the mass.

(2) Titration

Titration was carried out using a 0.04 mol/l potassium hydroxide solution (ethanol solution) with a previously known factor (NF). Phenol red was used as an indicator and the moment where the greenish yellow color was changed rose pink was defined as a finishing point and the titration amount (ml) of the potassium hydroxide solution was determined. The titration amounts of the samples A, B, and C were denoted as XA, XB, and XC (ml) and the titration amounts of the samples a, b, and c were denoted as Xa, Xb, and Xc (ml).

(3) Calculation of Acid Value

Using the titration amounts XA, XB, and XC for the respective dissolution times, the titration amount V (ml) at a dissolution time of 0 min was calculated by a least squares method. Similarly, the titration amount V0 (ml) was calculated using Xa, Xb, and Xc. Next, the acid value (eq/ton) was calculated according to the following equation.

$$\text{Acid Value(eq/ton)}=[(V-V0)\times 0.04\times NF\times 1000]/W$$

<Apparent Density of Film>

The apparent density of the film was measured according to JIS K 7222 "Cellular plastics and rubbers—Determination of apparent density". For simplifying the expression, its unit was calculated in $g/cm^3$.

<Whiteness of Film>

The whiteness of the film was measured according to JIS L 1015-1981-method B using Z-1001DP manufactured by NIPPON DENSHOKU INDUSTRIES CO., LTD. Here, the whiteness can be measured in the same manner, also in the case of the sealing sheet for a back surface of a solar cell. The measurement was made with light from the layer A side.

<Average Reflectance of Film>

An integrating sphere was attached to a spectrophotometer (manufactured by SHIMADZU CORPORATION, automatic spectrophotometer "UV-3150"), and the spectral reflectance was measured by making corrections so that the reflectance of a standard white plate (a white standard plate "ZRS-99-010-W" manufactured by Sphere Optics GmbH) was 100%. The spectral reflectance was measured in the range of a wavelength of 400 to 800 nm every 1 nm to obtain the mean value. The measurement was made with a non-reflecting black cardboard placed on the back side of a sample film. The measurement was made with light from the layer A side. Here, the reflectance can be measured in the same manner, also in the case of the sealing sheet for a back surface of a solar cell.

<Variation of Light Reflectance of Film>

In the resulting film roll, the start and end of roll winding were defined as 0% and 100%, respectively, and a film piece of 1 m×1.8 m was cut out from the central area at each of the length positions 10%, 50% and 90%. Five film samples in 20 cm squares were sampled from four corners and the center of each film piece, and the average reflectance of each sample was measured by the method of "Average Reflectance of Film". The mean value of the average reflectances in each film sample was defined as a central value, and the value obtained after dividing the difference between the maximum and the minimum values of the average reflectance by the central value was defined as the variation of the light reflectance.

<Accelerated Photo Degradation Test>

A continuous UV irradiation treatment was conducted on the side of the layer concentrically containing inorganic fine particles (layer A) of the sealing sheet for a back surface of a solar cell for 100 hours at 63° C., 50% RH and irradiation intensity of 100 mW/cm² using Eye Super UV Tester (SUV-W151 manufactured by IWASAKI ELECTRIC CO., LTD.).

<Accelerated Hydrolysis Test>

The HAST (Highly Accelerated temperature and humidity Stress Test), which is standardized by JIS C 60068-2-66, was performed. The sample was cut into 70 mm×190 mm, and was placed using a jig at such distances as not to make contact with each other. The treatment was performed at 105° C., 100% RH and 0.03 MPa, for 200 hours, using EHS-221 manufactured by ESPEC Corp.

<Breaking Elongation Retention>

The hydrolysis resistance and light resistance were evaluated in accordance with the breaking elongation retention. The breaking elongation of each sample before treatment and after treatment was measured according to JIS C 2318-1997 5.3.31 (tensile strength and elongation) and the breaking elongation retention was calculated according to the following equation.

Breaking elongation retention (%)=[(breaking elongation after treatment)×100]/(breaking elongation before treatment)

As for elongation retention after accelerated photo degradation test, it was evaluated as x when the value was less than 35%, ○ when the value was from 35% or more and less than 60%, and ⊙ when the value was 60% or more. When the film was broken before the coating layer in the surface was broken, the point when the film was broken was defined as breaking elongation.

As for elongation retention after accelerated hydrolysis test, it was evaluated as x when the value was less than 50%, ○ when the value was from 50% or more and less than 70%, and ⊙ when the value was 70% or more.

<Change of Color b* Value>

The sample film was cut into 40 mm×40 mm, using a standard white plate of X=94.19, Y=92.22 and Z=110.58, by a color b* value difference meter (ZE-2000 manufactured by NIPPON DENSHOKU INDUSTRIES CO., LTD.), the color b* values of the sample film before and after the accelerated photo degradation test were measured according to JIS K 7105-1981 5.3.5(a). The change of the color b* value was obtained in accordance with the following equation.

Change of color $b^*$ value=(Color $b^*$ value after accelerated photo degradation test)−(Color $b^*$ value before accelerated photo degradation test)

As for the change of the color b* value, it was evaluated as x when the value was higher than 12, ○ when the value was from 5 to 12, and ⊙ when the value was less than 5.

Thermal Shrinkage Rate of Longitudinal Direction at 150° C. (HS 150)

A sample was cut into a size of 10 mm in width and 250 mm in length along such a direction that longer sides (250 mm) each coincided with the longer direction, the film was marked at an interval of 200 mm, and an interval A was measured under a fixed tension of 5 g. Subsequently, the sample was left standing in an oven in an atmosphere of 150° C. for 30 minutes under no-load. The sample was taken out from the oven and cooled to room temperature, a marked interval B was determined under a fixed tension of 5 g, and a thermal shrinkage rate was determined by the following equation.

The thermal shrinkage rate of the film at 150° C. was measured at points in which sample was divided equally among three in the film width direction, average values for 3 points were rounded off to two decimal places.

Thermal shrinkage rate (%)=[(A−B)×100]/A

<MOR-C>

The resulting film was divided into five equal parts in a width direction, a square sample of 100 mm in longitudinal and width directions was collected in each position, and measurement was conducted using a microwave permeation molecular orientation meter (MOA-6004 manufactured by Oji Scientific Instruments). MOR-C was obtained with the thickness correction of 50 μm, and a mean value of five points was used.

<Surface Strength>

The sample film cut out into 5 cm×20 cm was fully adhered onto a flat plate glass using a polyester double-sided adhesive tape A so that the side of the layer concentrically containing inorganic fine particles (layer A) was laid outside. An adhesive tape B (manufactured by Nichiban Co., Ltd.; Cellotape (registered trademark)) of 24 mm width was adhered onto the surface of the sample film over a length of 35 mm followed by being allowed to stand for 1 minute. After that, the adhesive tape B was peeled off at a time in a direction vertical to the glass surface, and the surface of the side of the layer concentrically containing inorganic fine particles (layer A) was observed.

When the sample film surface was peeled off to an extent of 50% or more of the peeled area of the adhesive tape B, it was defined as "peeled off", when the frequency of "peeled off" was less than one half upon five or more repetitions, it was evaluated as "○" (excellent in surface strength), and when the above was one half or more, it was evaluated as "x" (inferior in surface strength).

<Adhesion>

The sealing sheet for a back surface of a solar cell cut into 100 mm×100 mm and the following EVA sheet cut into 70 mm×90 mm were prepared, and superposed in a configuration of a sealing sheet for a back surface of a solar cell/an EVA sheet/a sealing sheet for a back surface of a solar cell (both sealing sheets for a back surface of a solar cell were disposed such that the coating layer side was opposed to the EVA sheet.), then heated and pressed in the following adhesion conditions, to prepare a sample. The prepared sample was cut into 20 mm×100 mm, then adhered to a SUS plate, and the peel strength between the film layer and the EVA sheet layer was measured using a tensile tester in the following conditions. The peel strength was obtained as a mean value of the portions stably peeled after exceeding the maximum point. Adhesion was ranked according to the following criteria.

○: All samples using EVA showed an adhesion of 75 N/20 mm or more.

Δ: Adhesion was less than 50 N/20 mm in the samples using 1 to 3 types of EVA.

x: All samples using EVA showed an adhesion of less than 50 N/20 mm.

(Conditions for Preparing Sample)

Apparatus: Vacuum laminator (manufactured by NPC Incorporated, LM-30×30 type)

Pressure: 1 atmospheric pressure

EVA sheet:

A. Standard cure type

I. UltraPearl (registered trademark) PV standard cure Type (0.4 mm) manufactured by SANVIC INC.

Laminating step: at 100° C. (for 5 minutes in vacuo and for 5 minutes with pressure in vacuo)

Curing step: thermal treatment at 150° C. (at ordinary pressure for 45 minutes)

II. SOLAR EVA (registered trademark) SC4 (0.4 mm) manufactured by Mitsui Fabro, Inc.

Laminating step: at 130° C. (for 5 minutes in vacuo and for 5 minutes with pressure in vacuo)

Curing step: thermal treatment at 150° C. (at ordinary pressure for 45 minutes)

B. Fast cure type

I. UltraPearl (registered trademark) PV fast cure Type (0.45 mm) manufactured by SANVIC INC.

Laminating step: at 135° C. (for 5 minutes in vacuo and for 15 minutes with pressure in vacuo)

II. SOLAR EVA (registered trademark) RCO2B (0.45 mm) manufactured by Mitsui Fabro, Inc.

Laminating step: at 150° C. (for 5 minutes in vacuo and for 15 minutes with pressure in vacuo)

<Retention of Adhesive Strength>

The peel strength of sample for measuring adhesion (using standard type EVA manufactured by SANVIC INC.) was measured after treating at 105° C. and 100% RH for 150 hours, and evaluated as a maintenance rate relative to the initial peel strength.

◯: The peel strength of 60% or more of the initial peel strength was maintained.

x: The peel strength was less than 60% of the initial peel strength.

<Partial Discharge Voltage>

Partial discharge voltage Umax (V) was measured according to the following measuring method.

(Measuring Method)

Standards used: IE050664/A2:2002 4.1.2.4

Testing machine: KPD2050 (manufactured by KIKUSUI ELECTRONICS CORP.)

Starting voltage charge threshold value: 1.0 pC

Extinction voltage charge threshold value: 1.0 pC

Testing time: 22.0 s

Measured pattern: trapezoid

Number of measurement: average of 10 points (Evaluation)

◯: 1000 eV or more

Δ: 800 eV or more, less than 1000 eV x: less than 800 eV

<Water Vapor Permeability>

The water vapor permeability was measured with a water vapor-gas permeability meter (PERMATRAN-W3/31 manufactured by Modern Control Inc.) after purging for 2 days at a temperature of 40° C. and a humidity of 90% RH according to JIS K 7129 B. The unit is g/m$^2$/24 hr (1 day).

<Appearance Change>

A tempered glass (70 mm×150 mm, thickness of 3 mm), an EVA sheet (UltraPearl (registered trademark) PV (0.45 mm) manufactured by SANVIC INC., a tempered glass (30 mm×100 mm), the same EVA sheet and a sealing sheet for a back surface of a solar cell were superposed in this order, and the sealing sheet for a back surface of a solar cell and the EVA sheet were adhered using a vacuum laminator (at 135° C., for 5 minutes in vacuo and for 15 minutes with pressure in vacuo) to prepare a simulated solar cell module.

An accelerated photo degradation test and an accelerated hydrolysis test were performed on the resulting solar cell module, and the appearance was observed.

◯: Initial appearance was mostly maintained.

Δ: Slight peeling at the end surface, fine cracks and surface degradation on the sealing sheet for a back surface of a solar cell, slight yellowing and the like were found, but did not generate problems.

x: Peeling at the end surface, cracks on the sealing sheet for a back surface of a solar cell and yellowing were found.

<Production 1 of Polyester Resin Pellet>

(1) Production of PET Resin Pellet I (PET-I)

The temperature of an esterification reactor was raised, and when it reached 200° C., a slurry comprising 86.4 parts by mass of terephthalic acid and 64.4 parts by mass of ethylene glycol was charged, and as catalysts, 0.017 parts by mass of antimony trioxide and 0.16 parts by mass of triethylamine were added thereto with stirring. Subsequently, the temperature was raised with pressure, and under the conditions of a gauge pressure of 3.5 kgf/cm$^2$ (343 kPa) and 240° C., an esterification reaction was conducted under pressure. Thereafter, the air inside of the esterification reactor was returned to atmospheric pressure, and 0.071 parts by mass of magnesium acetate tetrahydrate, then 0.014 parts by mass of trimethyl phosphate were added thereto. Furthermore, the temperature was raised up to 260° C. over 15 minutes, 0.012 parts by mass of trimethyl phosphate, then 0.0036 parts by mass of sodium acetate were added thereto. After 15 minutes, the resulting esterification reaction product was transferred to a polycondensation reactor, and the temperature was gradually raised from 260° C. to 280° C. under reduced pressure, then a polycondensation reaction was carried out at 285° C.

After completion of the polycondensation reaction, a filtration treatment was conducted using a filter made of NASLON (registered trademark) where a 95%-cut radius was 5 μm, and the filtrate was extruded from a nozzle into a strand shape and cooled and solidified using a cooling water which was previously subjected to a filtering treatment (pore size: 1 μm or less), and was cut into pellets. The intrinsic viscosity and acid value of the resulting PET resin pellet (PET-I) were 0.616 dl/g and 15.1 eq/ton, respectively, and neither inactive particles nor internally precipitated particles were substantially contained.

(2) Production of PET Resin Pellet II (PET-II)

The PET resin pellet I (PET-I) was previously subjected to preliminary crystallization at 160° C., then subjected to a solid-phase polymerization under a nitrogen atmosphere at a temperature of 220° C. to give a PET resin pellet II (PET-II) having an intrinsic viscosity of 0.71 dl/g and an acid value of 11 eq/ton.

(3) Production of PET Resin Pellet III (PET-III)

The same procedure as in the PET resin pellet I (PET-I) was carried out, except for changing the polycondensation reaction time, to obtain a PET resin pellet III (PET-III) having an intrinsic viscosity of 0.51 dl/g and an acid value of 39 eq/ton.

(4) Production of PET Resin Pellet IV (PET-IV) (Preparation of Polycondensation Catalyst Solution)

a) Preparation of Ethylene Glycol Solution of Phosphorus Compound

After 2.0 liters of ethylene glycol was added to a flask equipped with a nitrogen inlet tube and a cooling tube under ordinary temperature and atmospheric pressure, 200 g of Irganox (registered trademark) 1222 (manufactured by Ciba Specialty Chemicals Inc. (current BASF Japan Ltd.)) was added as a phosphorus compound with stirring at 200 rpm under a nitrogen atmosphere. More 2.0 liters of ethylene glycol was further added, then the temperature was raised by changing the temperature set for the jacket to 196° C., and from the point of time when the inner temperature reached 185° C. or more, stirring was conducted under refluxing for 60 minutes. After that, heating was discontinued, and the solution was immediately removed from the heat source and cooled down to 120° C. or lower within 30 minutes while the nitrogen atmosphere was maintained. The mol fraction of Irganox 1222 in the resulting solution was 40%, and the mol fraction of a compound in which the structure was changed from Irganox 1222 was 60%.

b) Preparation of Ethylene Glycol Solution of Aluminum Compound

After 5.0 liters of pure water was added to a flask equipped with a cooling tube under ordinary temperature and atmospheric pressure, 200 g of basic aluminum acetate was added as a slurry in pure water with stirring at 200 rpm. Pure water was further added so as to make 10.0 liters as a whole followed by stirring for 12 hours under ordinary temperature and atmospheric pressure. Thereafter, the temperature was raised by changing the temperature set for the jacket to 100.5° C., and from the point of time when the inner temperature reached 95° C. or more, stirring was conducted under refluxing for 3 hours. The stirring was discontinued, and the mixture solution was allowed to cool to room temperature to obtain an aqueous solution of aluminum compound.

To the resulting aqueous solution of aluminum compound, the equivalent volume of ethylene glycol was added and the mixture was stirred at room temperature for 30 minutes, then the inner temperature was controlled to 80 to 90° C. The pressure was gradually reduced to reach 27 hPa, and water was evaporated from the system by stirring for several hours to obtain an ethylene glycol solution of aluminum compound of 20 g/l. The peak integral value ratio in 27Al-NMR spectrum of the resulting aluminum solution was 2.2.

(Esterification Reaction and Polycondensation)

In a continuous polyester manufacturing apparatus comprising three continuous esterification reactors and three polycondensation reactors and having an in-line mixer with a high-speed stirrer being installed in a transfer line from the third esterification reactor to the first polycondensation reactor, 0.75 parts by mass of ethylene glycol was continuously fed to a slurry-preparing tank to 1 part by mass of highly pure terephthalic acid. The prepared slurry was continuously fed under such reaction conditions that the reaction temperatures and pressures of the first, second and third esterification reactors were set at 250° C. and 110 kPa; 260° C. and 105 kPa; and 260° C. and 105 kPa, respectively, to obtain a polyester oligomer. Here, 0.025 parts by mass of ethylene glycol was continuously poured into the second esterification reactor. The resulting oligomer was continuously transferred to a continuous polycondensation apparatus comprising three reactors, and at the same time, the ethylene glycol solution of an aluminum compound and the ethylene glycol solution of a phosphorus compound prepared by the above methods were continuously added to an in-line mixer installed in the transfer line with stirring using a continuous mixer so that the content of aluminum atom and the content of phosphorus atom were made 0.015% by mol and 0.036% by mol, respectively, based on the acid component in the polyester. Then, polycondensation was carried out under such reaction conditions that reaction temperatures and pressures of the initial, intermediate and final polycondensation reactors were 265° C. and 9 kPa; 265 to 268° C. and 0.7 kPa; and 273° C. and 13.3 Pa, respectively to obtain a PET resin pellet IV (PET-IV) having an intrinsic viscosity of 0.63 dl/g and an acid value of 10.5 eq/ton.

(5) Production of PET Resin Pellet V (PET-V)

Solid-phase polymerization was conducted using the resulting PET resin pellet IV (PET-IV) with a rotary vacuum polymerization reactor under a reduced pressure of 0.5 mmHg at 220° C. to obtain a PET resin pellet V (PET-V) having an intrinsic viscosity of 0.73 dl/g and an acid value of 5.0 eq/ton.

<Production of Fine Particles-Containing Master Batch Pellet>

(6) Production of Master Batch Pellet I (MB-I)

As raw materials, a mixture of 50% by mass of a PET resin pellet I (PET-I) previously dried at 120° C. under $10^{-3}$ torr (about 0.133 Pa) for about 8 hours with 50% by mass of rutile-type titanium dioxide having an average particle size of 0.3 μm (value obtained according to an electron microscopic method) was fed to a biaxial vent-type extruder and extruded at 275° C. with deaeration by kneading to obtain a master batch pellet I (MB-I) containing fine particles of rutile-type titanium dioxide. This pellet had an intrinsic viscosity of 0.45 dl/g and an acid value of 42.2 eq/ton.

(7) Production of Master Batch Pellet II (MB-II)

Solid-phase polymerization was conducted using the master batch pellet I (MB-I) with a rotary vacuum polymerization reactor under a reduced pressure of 0.5 mmHg at 220° C. to obtain a master batch pellet II (MB-II) having an intrinsic viscosity of 0.71 dl/g and an acid value of 23.5 eq/ton.

(8) Production of Master Batch Pellet III (MB-III)

The same procedure as in the master batch pellet I (MB-1) was carried out, except using PET resin pellet IV (PET-IV) in place of the PET resin pellet I (PET-I) to obtain a master batch pellet III (MB-III) containing fine particles of rutile type titanium dioxide. This pellet had an intrinsic viscosity of 0.46 dl/g and an acid value of 36.3 eq/ton.

(9) Production of Master Batch Pellet IV (MB-IV)

Solid-phase polymerization was conducted using the master batch pellet III (MB-III) with a rotary vacuum polymerization reactor under a reduced pressure of 0.5 mmHg at 220° C. to obtain a master batch pellet IV (MB-IV) containing fine particles of rutile type titanium dioxide having an intrinsic viscosity of 0.70 dl/g and an acid value of 19.4 eq/ton.

<Preparation of Coating Liquid>

43.75 parts by mass of 4,4-diphenylmethane diisocyanate, 12.85 parts by mass of dimethylolbutanoic acid, 153.41 parts by mass of polyhexamethylenecarbonate diol having the number-average molecular weight of 2000, 0.03 parts by mass of dibutyl tin dilaurate and 84.00 parts by mass of acetone as a solvent were charged, and stirred at 75° C. for 3 hours under a nitrogen atmosphere, the temperature of the resulting reaction solution was lowered to 40° C., then 8.77 parts by mass of triethylamine was added to obtain a polyurethane prepolymer solution. 450 parts by mass of water was added to the polyurethane prepolymer solution, and the mixture was adjusted to 25° C. and stirred and mixed at 2000 $min^{-1}$, so that the polyurethane prepolymer solution was dispersed in water. Thereafter, acetone and a part of water were removed under reduced pressure to prepare a water-soluble polyurethane resin solution containing a solid content of 35%. The resulting polyurethane resin had a glass transition temperature of −30° C.

Subsequently, the ingredients were mixed so as to have 55.86% by mass of water, 30.00% by mass of isopropanol, 13.52% by mass of the polyurethane resin solution obtained above, 0.59% by mass of particles (silica sol having an average particle size of 40 nm, solid content concentration of 40% by mass) and 0.03% by mass of surfactant (silicone type; solid content concentration of 100% by mass) to prepare a coating liquid.

Production of Polyester Film for Sealing Back Surface of Solar Cell

Example 1

Raw materials of the layer concentrically containing fine particles (layer A) obtained by mixing 60% by mass of PET-II and 40% by mass of MB-II and raw materials of other layer obtained by mixing 86% by mass of PET-II and 14% by mass of MB-II (layer B) were each charged into a separate extruder, mixed and melted at 285° C., then conjugated in a melted state so as to give layer A/layer B by using a feed-block. At that time, the rate of discharge amounts for the layer A to the layer B was controlled using a gear pump. Subsequently, the resulting substance was extruded using a T-die onto a cooling drum adjusted to 30° C. to prepare a non-stretched sheet.

The resulting non-stretched sheet was uniformly heated at 75° C. using a heating roll and subjected to roll stretching (longitudinal stretching) of 3.3 times by heating at 100° C. with a non-contacting heater. The coating liquid prepared above was applied to the B layer side of the resulting uniaxially stretched film by a roll coating method such that the coating amount after final (after biaxial stretching) drying is 0.15 g/m$^2$, then dried at 80° C. for 20 seconds. Thereafter, the uniaxially stretched film was introduced to a tenter, subjected to a transverse stretch of 4.0 times by heating at 140° C., subjected to a heating treatment at 215° C. for 5 seconds by fixing its width and further subjected to a 4% relaxation treatment at 210° C. in a width direction to obtain a polyester film roll for sealing a back surface of a solar cell having a thickness of 250 μm. This was used as a sealing sheet for a back surface of a solar cell as it was.

Examples 2 to 7

The same procedure was carried out as in Example 1, except that the thicknesses of the layer A and the layer B and the raw material compositions of the layer A and the layer B were changed as shown in Table 1, to obtain a polyester film roll for sealing a back surface of a solar cell. This was used as a sealing sheet for a back surface of a solar cell as it was.

Examples 8 to 12

The same procedure was carried out as in Example 1, except that the thickness of the layer A and the layer B and the raw material composition of the layer A and the layer B were changed as shown in Table 2, to obtain a polyester film roll for sealing a back surface of a solar cell. This was used as a sealing sheet for a back surface of a solar cell as it was.

Example 13

The same procedure was carried out as in Example 3, except for changing the feed-block so as to give a configuration of layer A/layer B/layer A, to obtain a polyester film roll for sealing a back surface of a solar cell. This was used as a sealing sheet for a back surface of a solar cell as it was. Here, coating was applied to only one side.

Example 14

The same procedure was carried out as in Example 1, except that raw materials of the layer concentrically containing fine particles (layer A) obtained by mixing 64% by mass of PET-V and 36% by mass of MB-IV, raw materials of a layer including only PET-V (layer B1), and raw materials of other layer obtained by mixing 98% by mass of PET-V and 2% by mass of MB-IV (layer B2) were each charged into a separate extruder so as to give a configuration of layer A/layer B1/layer B2, to obtain a polyester film roll for sealing a back surface of a solar cell. This was used as a sealing sheet for a back surface of a solar cell as it was.

Example 15

The film roll obtained in Example 8 was passed through an off-line coater set at a temperature of 160° C. and subjected to a relaxation treatment by adjusting the speed and the tension to obtain a polyester film roll for sealing a back surface of a solar cell. This was used as a sealing sheet for a back surface of a solar cell as it was.

TABLE 1

| Composition of Each Layer | | | Example 1 | Example 2 | Example 3 | Example 4 | Example 5 | Example 6 | Example 7 |
|---|---|---|---|---|---|---|---|---|---|
| Layer A | PET Resin Pellet | Raw Materials | PET-II | PET-II | PET-II | PET-II | PET-II | PET-II | PET-II |
| | | Intrinsic Viscosity (dl/g) | 0.71 | 0.71 | 0.71 | 0.71 | 0.71 | 0.71 | 0.71 |
| | | Ratio (% by mass) | 60 | 64 | 64 | 76 | 64 | 64 | 64 |
| | MB Pellet | Raw Materials | MB-II | MB-II | MB-II | MB-II | MB-II | MB-II | MB-II |
| | | Intrinsic Viscosity (dl/g) | 0.71 | 0.71 | 0.71 | 0.71 | 0.71 | 0.71 | 0.71 |
| | | Ratio (% by mass) | 40 | 36 | 36 | 24 | 36 | 36 | 36 |
| | Concentration of Fine Particles (% by mass) | | 20 | 18 | 18 | 12 | 18 | 18 | 18 |
| Layer B | PET Resin Pellet | Raw Materials | PET-II | PET-II | PET-II | PET-II | PET-II | PET-II | PET-II |
| | | Intrinsic Viscosity (dl/g) | 0.71 | 0.71 | 0.71 | 0.71 | 0.71 | 0.71 | 0.71 |
| | | Ratio (% by mass) | 86 | 97 | 98 | 98 | 98 | 98 | 98 |
| | MB Pellet | Raw Materials | MB-II | MB-II | MB-II | MB-II | MB-II | MB-II | MB-II |
| | | Intrinsic Viscosity (dl/g) | 0.71 | 0.71 | 0.71 | 0.71 | 0.71 | 0.71 | 0.71 |
| | | Ratio (% by mass) | 14 | 3 | 2 | 2 | 2 | 2 | 2 |
| | Intrinsic Viscosity (dl/g) | | 0.67 | 0.68 | 0.68 | 0.68 | 0.69 | 0.69 | 0.69 |
| | Acid Value (eq/ton) | | 22 | 20 | 19 | 18 | 15 | 14 | 14 |
| | Concentration of Fine Particles (% by mass) | | 7 | 1.5 | 1 | 1 | 1 | 1 | 1 |
| Thickness of Each Layer (μm) | (Layer A/Layer B) | | 50/200 | 50/200 | 50/200 | 45/180 | 25/225 | 15/235 | 10/240 |
| | (Layer A/Layer B/Layer A) | | — | — | — | — | — | — | — |
| Thickness Ratio of Layer A (%) | | | 20 | 20 | 20 | 20 | 10 | 6 | 4 |
| Total Thickness of Film (μm) | | | 250 | 250 | 250 | 225 | 250 | 250 | 250 |
| Total Concentration of Fine Particles (% by mass) | | | 9.6 | 4.8 | 4.4 | 3.2 | 2.7 | 2.02 | 1.68 |

TABLE 2

| Composition of Each Layer | | | Example 8 | Example 9 | Example 10 | Example 11 | Example 12 | Example 13 | Example 14 | Example 15 |
|---|---|---|---|---|---|---|---|---|---|---|
| Layer A | PET Resin Pellet | Raw Materials | PET-V | PET-V | PET-V | PET-II | PET-II | PET-II | PET-V | PET-V |
| | | Intrinsic Viscosity (dl/g) | 0.73 | 0.73 | 0.73 | 0.71 | 0.71 | 0.71 | 0.73 | 0.73 |
| | | Ratio (% by mass) | 64 | 64 | 64 | 64 | 64 | 70 | 64 | 64 |
| | MB Pellet | Raw Materials | MB-IV | MB-IV | MB-IV | MB-II | MB-II | MB-II | MB-IV | MB-IV |
| | | Intrinsic Viscosity (dl/g) | 0.7 | 0.7 | 0.7 | 0.71 | 0.71 | 0.71 | 0.7 | 0.7 |
| | | Ratio (% by mass) | 36 | 36 | 36 | 36 | 36 | 30 | 36 | 36 |
| | Concentration of Fine Particles (% by mass) | | 18 | 18 | 18 | 18 | 18 | 15 | 18 | 18 |
| Layer B | PET Resin Pellet | Raw Materials | PET-V | PET-V | PET-V | PET-II | PET-II | PET-II | PET-V/PET-V | PET-V |
| | | Intrinsic Viscosity (dl/g) | 0.73 | 0.73 | 0.73 | 0.71 | 0.71 | 0.71 | 0.73/0.73 | 0.73 |
| | | Ratio (% by mass) | 98 | 98 | 100 | 98 | 98 | 98 | 100/98 | 98 |
| | MB Pellet | Raw Materials | MB-IV | MB-IV | — | MB-II | MB-II | MB-II | —/MB-IV | MB-IV |
| | | Intrinsic Viscosity (dl/g) | 0.7 | 0.7 | — | 0.71 | 0.71 | 0.71 | —/0.7 | 0.7 |
| | | Ratio (% by mass) | 2 | 2 | — | 2 | 2 | 2 | 0/2 | 2 |
| | Intrinsic Viscosity (dl/g) | | 0.69 | 0.69 | 0.7 | 0.69 | 0.69 | 0.69 | 0.69 | 0.69 |
| | Acid Value (eq/ton) | | 9 | 9 | 9 | 14 | 15 | 14 | 10 | 10 |
| | Concentration of Fine Particles (% by mass) | | 1 | 1 | 0 | 1 | 1 | 1 | 0/1 | 1 |
| Thickness of Each Layer (μm) | (Layer A/Layer B) | | 25/225 | 15/235 | 10/240 | 15/315 | 15/173 | — | 25/(125/100) | 25/225 |
| | (Layer A/Layer B/Layer A) | | — | — | — | — | — | 12/201/12 | — | — |
| Thickness Ratio of Layer A (%) | | | 10 | 6 | 4 | 4.5 | 8 | 10.7 | 20 | 10 |
| Total Thickness of Film (μm) | | | 250 | 250 | 250 | 330 | 188 | 250 | 250 | 250 |
| Total Concentration of Fine Particles (% by mass) | | | 2.7 | 2.02 | 0.72 | 1.8 | 2.4 | 2.5 | 3.9 | 2.7 |

Comparative Examples 1 to 6

The same procedure was carried out as in Example 1, except that the thicknesses of the layer A and the layer B and the raw material compositions of the layer A and the layer B were changed as shown in Table 3, to obtain a polyester film roll for sealing a back surface of a solar cell. This was used as a sealing sheet for a back surface of a solar cell as it was.

TABLE 3

| Composition of Each Layer | | | Comparative Example 1 | Comparative Example 2 | Comparative Example 3 | Comparative Example 4 | Comparative Example 5 | Comparative Example 6 |
|---|---|---|---|---|---|---|---|---|
| Layer A | PET Resin Pellet | Raw Materials | PET-II | PET-III | PET-II | PET-II | PET-II | PET-II |
| | | Intrinsic Viscosity (dl/g) | 0.71 | 0.51 | 0.71 | 0.71 | 0.71 | 0.71 |
| | | Ratio (% by mass) | 100 | 64 | 94 | 60 | 20 | 64 |
| | MB Pellet | Raw Materials | — | MB-I | MB-II | MB-II | MB-II | MB-II |
| | | Intrinsic Viscosity (dl/g) | — | 0.45 | 0.71 | 0.71 | 0.71 | 0.71 |
| | | Ratio (% by mass) | — | 36 | 6 | 40 | 80 | 36 |
| | Concentration of Fine Particles (% by mass) | | 0 | 18 | 3 | 20 | 40 | 18 |
| Layer B | PET Resin Pellet | Raw Materials | PET-II | PET-III | PET-II | PET-II | PET-II | PET-II |
| | | Intrinsic Viscosity (dl/g) | 0.71 | 0.51 | 0.71 | 0.71 | 0.71 | 0.71 |
| | | Ratio (% by mass) | 100 | 97 | 98 | 60 | 80 | 98 |
| | MB Pellet | Raw Materials | — | MB-I | MB-II | MB-II | MB-II | MB-II |
| | | Intrinsic Viscosity (dl/g) | — | 0.45 | 0.71 | 0.71 | 0.71 | 0.71 |
| | | Ratio (% by mass) | — | 3 | 2 | 40 | 20 | 2 |
| | Intrinsic Viscosity (dl/g) | | 0.67 | 0.47 | 0.67 | 0.66 | 0.67 | 0.67 |
| | Acid Value (eq/ton) | | 15 | 44 | 19 | 28 | 26 | 19 |
| | Concentration of Fine Particles (% by mass) | | 0 | 1.5 | 1 | 20 | 10 | 1 |
| Thickness of Each Layer (μm) | (Layer A/Layer B) | | 50/200 | 50/200 | 45/180 | 45/180 | 45/180 | 16/64 |
| | (Layer A/Layer B/Layer A) | | — | — | — | — | — | — |
| Thickness Ratio of Layer A (%) | | | 20 | 20 | 20 | 20 | 20 | 20 |
| Total Thickness of Film (μm) | | | 250 | 250 | 225 | 225 | 225 | 80 |
| Total Concentration of Fine Particles (% by mass) | | | 0 | 4.8 | 1.4 | 20 | 16 | 4.4 |

Characteristics of the sealing sheets for a back surface of a solar cell obtained in Examples and Comparative Examples were shown in Tables 4 to 6.

TABLE 4

| | Example 1 | Example 2 | Example 3 | Example 4 | Example 5 | Example 6 | Example 7 |
|---|---|---|---|---|---|---|---|
| Intrinsic Viscosity (dl/g) | 0.67 | 0.68 | 0.68 | 0.69 | 0.69 | 0.69 | 0.69 |
| Content of DEG (% by mol) | 1.5 | 1.6 | 1.6 | 1.6 | 1.6 | 1.6 | 1.6 |
| Acid Value (eq/ton) | 25 | 21 | 20 | 18 | 15 | 15 | 14 |
| Apparent Density (g/cm$^3$) | 1.4 | 1.39 | 1.39 | 1.39 | 1.39 | 1.39 | 1.39 |
| Whiteness | 95 | 95 | 95 | 94 | 95 | 95 | 94 |
| Average Reflectance (%) | 84 | 82 | 82 | 79 | 76 | 72 | 70 |
| Variation of Light Reflectance (%) | 2 | 2 | 1 | 1 | 2 | 2 | 2 |

TABLE 4-continued

|  | Example 1 | Example 2 | Example 3 | Example 4 | Example 5 | Example 6 | Example 7 |
|---|---|---|---|---|---|---|---|
| Breaking Elongation Retention after Accelerated Hydrolysis (%) | ○ | ◎ | ◎ | ◎ | ◎ | ◎ | ◎ |
| Breaking Elongation Retention after Accelerated Photo Degradation (%) | ◎ | ◎ | ◎ | ◎ | ◎ | ◎ | ◎ |
| Change of Color b* Value | ◎ | ◎ | ◎ | ○ | ◎ | ◎ | ◎ |
| HS150 (%) | 2.4 | 2.3 | 2.4 | 2.3 | 2.3 | 2.3 | 2.3 |
| MOR-C | 1.73 | 1.72 | 1.74 | 1.72 | 1.73 | 1.74 | 1.72 |
| Surface Strength | ○ | ○ | ○ | ○ | ○ | ○ | ○ |
| Partial Discharge Voltage (V) | ○ | ○ | ○ | ○ | ○ | ○ | ○ |
| Water Vapor Permeability (g/m$^2$/d) | 2.3 | 2.3 | 2.3 | 2.5 | 2.3 | 2.3 | 2.3 |
| Adhesion | ○ | ○ | ○ | ○ | ○ | ○ | ○ |

TABLE 5

|  | Example 8 | Example 9 | Example 10 | Example 11 | Example 12 | Example 13 | Example 14 | Example 15 |
|---|---|---|---|---|---|---|---|---|
| Intrinsic Viscosity (dl/g) | 0.69 | 0.69 | 0.69 | 0.69 | 0.69 | 0.69 | 0.69 | 0.69 |
| Content of DEG (% by mol) | 1.6 | 1.6 | 1.6 | 1.6 | 1.6 | 1.6 | 1.6 | 1.6 |
| Acid Value (eq/ton) | 10 | 9 | 9 | 14 | 16 | 15 | 11 | 10 |
| Apparent Density (g/cm$^3$) | 1.39 | 1.39 | 1.38 | 1.39 | 1.39 | 1.39 | 1.39 | 1.39 |
| Whiteness | 95 | 95 | 94 | 95 | 95 | 94 | 95 | 95 |
| Average Reflectance (%) | 75 | 72 | 70 | 72 | 72 | 68 | 76 | 75 |
| Variation of Light Reflectance (%) | 2 | 2 | 2 | 2 | 2 | 2 | 2 | 2 |
| Breaking Elongation Retention after Accelerated Hydrolysis (%) | ◎ | ◎ | ◎ | ◎ | ◎ | ◎ | ◎ | ◎ |
| Breaking Elongation Retention after Accelerated Photo Degradation (%) | ◎ | ◎ | ◎ | ◎ | ◎ | ○ | ◎ | ◎ |
| Change of Color b* Value | ◎ | ◎ | ◎ | ◎ | ◎ | ○ | ◎ | ◎ |
| HS150 (%) | 2.3 | 2.3 | 2.3 | 2.3 | 2.3 | 2.3 | 2.3 | 0.4 |
| MOR-C | 1.73 | 1.74 | 1.73 | 1.75 | 1.7 | 1.72 | 1.72 | 1.73 |
| Surface Strength | ○ | ○ | ○ | ○ | ○ | ○ | ○ | ○ |
| Partial Discharge Voltage (V) | ○ | ○ | ○ | ○ | Δ | ○ | ○ | ○ |
| Water Vapor Permeability (g/m$^2$/d) | 2.3 | 2.3 | 2.3 | 1.8 | 3 | 2.3 | 2.3 | 2.3 |
| Adhesion | ○ | ○ | ○ | ○ | ○ | ○ | ○ | ○ |

TABLE 6

|  | Comparative Example 1 | Comparative Example 2 | Comparative Example 3 | Comparative Example 4 | Comparative Example 5 | Comparative Example 6 |
|---|---|---|---|---|---|---|
| Intrinsic Viscosity (dl/g) | 0.67 | 0.48 | 0.67 | 0.67 | 0.67 | 0.68 |
| Content of DEG (% by mol) | 1.5 | 1.6 | 1.5 | 1.5 | 1.5 | 1.6 |
| Acid Value (eq/ton) | 16 | 52 | 24 | 34 | 32 | 20 |
| Apparent Density (g/cm$^3$) | 1.39 | 1.39 | 1.39 | 1.39 | 1.39 | 1.38 |
| Whiteness | — | 95 | 50 | 95 | 95 | 95 |
| Average Reflectance (%) | 5 | 84 | 70 | 84 | 86 | 71 |
| Variation of Light Reflectance (%) | 2 | 2 | 2 | 2 | 2 | 1 |
| Breaking Elongation Retention after Accelerated Hydrolysis (%) | ◎ | X | ◎ | X | X | ◎ |
| Breaking Elongation Retention after Accelerated Photo Degradation (%) | X | ◎ | X | ◎ | ◎ | ◎ |
| Change of Color b* Value | X | ○ | X | ◎ | ◎ | ◎ |
| HS150 (%) | 2.6 | 2 | 2.2 | 2.1 | 2 | 2.4 |
| MOR-C | 1.73 | 1.74 | 1.72 | 1.71 | 1.73 | 1.65 |
| Surface Strength | ○ | X | ○ | ○ | X | ○ |
| Partial Discharge Voltage | ○ | ○ | ○ | ○ | ○ | X |
| Water Vapor Permeability (g/m$^2$/d) | 2.3 | 2.3 | 2.5 | 2.5 | 2.5 | 8 |
| Adhesion | ○ | ○ | ○ | ○ | ○ | ○ |

<Preparation of Solar Cell Module>

A tempered glass (300 mm×200 mm, thickness of 3 mm), an EVA sheet (UltraPearl (registered trademark) PV (0.45 mm) manufactured by SANVIC INC., a crystalline solar cell (150 mm×155 mm), the same EVA sheet and a sealing sheet for a back surface of a solar cell of each Example were superposed in this order, and the back sheet and the EVA sheet were adhered using a vacuum laminator (at 135° C., for 5 minutes in vacuo and for 15 minutes with pressure in vacuo) to prepare a solar cell module.

The resulting solar cell module was retained at 85° C., under an atmosphere of 85% RH, for 3000 hours. Thereafter, the appearance of the back sheet was observed, but peeling, cracks, yellowing and the like at the end surface were not found in all samples, and initial appearance was mostly maintained.

<Production 2 of Polyester Resin Pellet>
(1) Production of PET Resin Pellet a (PET-a)
a) Preparation of Ethylene Glycol Solution of Phosphorus Compound After 2.0 liters of ethylene glycol was added to a flask equipped with a nitrogen inlet tube and a cooling tube under ordinary temperature and atmospheric pressure, 200 g of Irganox (registered trademark) 1222 (manufactured by Ciba Specialty Chemicals Inc. (current BASF Japan Ltd.)) was added as a phosphorus compound with stirring at 200 rpm under a nitrogen atmosphere. More 2.0 liters of ethylene glycol was further added, then the temperature was raised by changing the temperature set for the jacket to 196° C., and from the point of time when the inner temperature reached 185° C. or more, stirring was conducted under refluxing for 60 minutes. After that, heating was discontinued, and the solution was immediately removed from the heat source and cooled down to 120° C. or lower within 30 minutes while the nitrogen atmosphere was maintained. The mol fraction of Irganox 1222 in the resulting solution was 40%, and the mol fraction of a compound in which the structure was changed from Irganox 1222 was 60%.

b) Preparation of Ethylene Glycol Solution of Aluminum Compound

After 5.0 liters of pure water was added to a flask equipped with a cooling tube under ordinary temperature and atmospheric pressure, 200 g of basic aluminum acetate was added as a slurry in pure water with stirring at 200 rpm. Pure water was further added so as to make 10.0 liters as a whole followed by stirring for 12 hours under ordinary temperature and atmospheric pressure. Thereafter, the temperature was raised by changing the temperature set for the jacket to 100.5° C., and from the point of time when the inner temperature reached 95° C. or more, stirring was conducted under refluxing for 3 hours. The stirring was discontinued, and the mixture solution was allowed to cool to room temperature to obtain an aqueous solution of aluminum compound.

To the resulting aqueous solution of aluminum compound, the equivalent volume of ethylene glycol was added and the mixture was stirred at room temperature for 30 minutes, then the inner temperature was controlled to 80 to 90° C. The pressure was gradually reduced to reach 27 hPa, and water was evaporated from the system by stirring for several hours to obtain an ethylene glycol solution of aluminum compound of 20 g/l.

(Esterification Reaction and Polycondensation)

In a continuous polyester manufacturing apparatus comprising three continuous esterification reactors and three polycondensation reactors and having an in-line mixer with a high-speed stirrer being installed in a transfer line from the third esterification reactor to the first polycondensation reactor, 035 parts by mass of ethylene glycol was continuously fed to a slurry-preparing tank to 1 part by mass of highly pure terephthalic acid. The prepared slurry was continuously fed under such reaction conditions that the reaction temperatures and pressures of the first, second and third esterification reactors were set at 250° C. and 110 kPa; 260° C. and 105 kPa; and 260° C. and 105 kPa, respectively, to obtain a polyester oligomer. Here, 0.025 parts by mass of ethylene glycol was continuously poured into the second esterification reactor. The resulting oligomer was continuously transferred to a continuous polycondensation apparatus comprising three reactors, and at the same time, the ethylene glycol solution of an aluminum compound and the ethylene glycol solution of a phosphorus compound prepared by the above method were continuously added to an in-line mixer installed in the transfer line with stirring using a continuous mixer so that the content of aluminum atom and the content of phosphorus atom were made 0.015% by mol and 0.036% by mol, respectively, based on the acid component in the polyester. Then, polycondensation was carried out under such reaction conditions that reaction temperatures and pressures of the initial, intermediate and final polycondensation reactors were 265° C. and 9 kPa; 265 to 268° C. and 0.7 kPa; and 273° C. and 13.3 Pa, respectively to obtain a PET resin pellet a (PET-a) having an intrinsic viscosity of 0.63 dl/g and an acid value of 10 eq/ton. Here, an ethylene glycol slurry of silica was added as a lubricant during polymerization, so as to have a silica content of 800 ppm after polymerization.

(2) Production of PET Resin Pellet b (PET-b)

Solid-phase polymerization was conducted using the resulting PET-a with a rotary vacuum polymerization reactor under a reduced pressure of 0.5 mmHg at 220° C. to obtain a PET resin pellet b (PET-b) having an intrinsic viscosity of 0.75 dl/g and an acid value of 5.0 eq/ton.

<Production of Master Batch Pellet Containing White Pigment>
(3) Production of Master Batch Pellet c (MB-c)

As raw materials, a mixture of 50% by mass of a PET-b previously dried at 120° C. under $10^{-3}$ torr (about 0.133 Pa) for about 8 hours with 50% by mass of rutile-type titanium dioxide having an average particle size of 0.3 μm (value obtained according to an electron microscopic method) was fed to a biaxial vent-type extruder and extruded at 275° C. with deaeration by kneading to obtain a master batch pellet c (MB-c) containing fine particles of rutile-type titanium dioxide. Here, the air inside of a supply hopper of the extruder was replaced with nitrogen. This pellet had an intrinsic viscosity of 0.63 dl/g and an acid value of 27 eq/ton. In order to avoid moisture absorption, the hopper of the extruder was set to a nitrogen atmosphere.

(4) Production of Master Batch Pellet d (MB-d)

As raw materials, a mixture of 50% by mass of a PET-a previously dried at 120° C. under $10^{-3}$ ton (about 0.133 Pa) for about 8 hours with 50% by mass of rutile-type titanium dioxide having an average particle size of 0.3 μm (value obtained according to an electron microscopic method) was fed to a biaxial vent-type extruder and extruded at 275° C. with deaeration by kneading to obtain a pellet. The pellet was subjected to solid-phase polymerization with a rotary vacuum polymerization reactor under a reduced pressure of 0.5 mmHg at 220° C. to obtain a master batch pellet d (MB-d) containing fine particles of rutile type titanium dioxide having an intrinsic viscosity of 0.74 dl/g and an acid value of 17 eq/ton. In order to avoid moisture absorption, the hopper of the extruder was set to a nitrogen atmosphere.

<Preparation of Coating Liquid>

A four-necked flask equipped with a stirrer, a Dimroth condenser, a nitrogen inlet tube, a silica gel drying tube and a thermometer was charged with 29.14 parts by mass of 4,4-diphenylmethane diisocyanate, 7.57 parts by mass of dimethylolbutanoic acid, 173.29 parts by mass of polyhexamethylenecarbonate diol having the number-average molecular weight of 3000, 0.03 parts by mass of dibutyl tin dilaurate and 84.00 parts by mass of acetone as a solvent, and the ingredients were stirred under a nitrogen atmosphere at 75° C. for 3 hours, then it was confirmed that the reaction solution reached a predetermined amine equivalent. Next, the temperature of this reaction solution was lowered to 40° C., then 5.17 parts by mass of triethylamine was added to obtain a polyurethane prepolymer solution. Next, 450 g of water was added to a reaction vessel equipped with a homodisper capable of high-speed stirring, and the mixture was adjusted to 25° C., then the polyurethane prepolymer solution was added thereto while stirring and mixing at 2000 min$^{-1}$, so that the polyurethane prepolymer solution was dispersed in water. Thereafter, acetone and a part of water were removed under reduced pressure to prepare an aqueous polyurethane resin solution containing a solid content of 35%.

Subsequently, the ingredients were mixed so as to have 55.86% by mass of water, 30.00% by mass of isopropanol, 13.52% by mass of the polyurethane resin solution obtained above, 0.59% by mass of particles (silica sol having an average particle size of 40 nm, solid content concentration of 40% by mass) and 0.03% by mass of surfactant (silicone type; solid content concentration of 100% by mass) to prepare a coating liquid.

Production of Sealing Sheet for Back Surface of Solar Cell

Example 16

Raw materials of the layer A obtained by mixing 70% by mass of PETb and 30% by mass of MB-c, raw materials of the layer B of 100% by mass of PETb, and raw materials of the layer C obtained by mixing 92% by mass of PETb and 8% by mass of MB-c were each charged into a separate extruder, mixed and melted at 285° C., then conjugated in a melted state so as to give layer A/layer B/layer C by using a feed-block. At that time, the rate of discharge amounts for each layer was controlled using a gear pump. Subsequently, the resulting substance was extruded using a T-die onto a cooling drum adjusted to 30° C. to prepare a non-stretched sheet. Here, each resin pellet dried to a water content of about 25 ppm was used, and the hopper of the extruder was set to a nitrogen atmosphere in order to avoid moisture absorption.

The resulting non-stretched sheet was uniformly heated at 75° C. using a heating roll and subjected to roll stretching (longitudinal stretching) of 3.3 times by heating at 100° C. with a non-contacting heater. The coating liquid prepared above was applied to the C layer side of the resulting uniaxially stretched film by a roll coating method such that the coating amount after final (after biaxial stretching) drying is 0.15 g/m$^2$, then dried at 80° C. for 20 seconds. Thereafter, the uniaxially stretched film was introduced to a tenter, subjected to a transverse stretch of 4.0 times by heating at 140° C., subjected to a heating treatment at 215° C. for 5 seconds by fixing its width and further subjected to a 4% relaxation treatment at 210° C. in a width direction to obtain a polyester film roll for sealing the back surface of a solar cell having a thickness of 250 μm. This was used as a sealing sheet for a back surface of a solar cell as it was.

Examples 17 to 27

The same procedure was carried out as in Example 16, except that the thicknesses and raw material compositions of the layer A, the layer B and the layer C were changed as shown in Table 7, to obtain a polyester film roll for sealing a back surface of a solar cell. Here, the thickness of each layer was adjusted by adjusting the discharge amount using a gear pump and by adjusting the outlet thickness of each layer in the feed-block. This was used as a sealing sheet for a back surface of a solar cell as it was.

TABLE 7

| | | Example 16 | Example 17 | Example 18 | Example 19 | Example 20 | Example 21 | Example 22 | Example 23 | Example 24 | Example 25 | Example 26 | Example 27 |
|---|---|---|---|---|---|---|---|---|---|---|---|---|---|
| Layer A | Polyester Resin | PET-b | PET-b | PET-b | PET-b | PET-b | PET-b | PET-b | PET-b | PET-b | PET-b | PET-b | PET-b |
| | Amount of Polyester Resin (% by mass) | 70 | 64 | 70 | 64 | 64 | 70 | 70 | 70 | 70 | 76 | 48 | 70 |
| | Master Batch | MB-c | MB-c | MB-c | MB-c | MB-c | MB-c | MB-c | MB-c | MB-c | MB-c | MB-c | MB-c |
| | Amount of Master Batch (% by mass) | 30 | 36 | 30 | 36 | 36 | 30 | 30 | 30 | 30 | 24 | 52 | 30 |
| | Content of White Pigment (% by mass) | 15 | 18 | 15 | 18 | 18 | 15 | 15 | 15 | 15 | 12 | 26 | 15 |
| | Acid Value (eq/ton) | 18 | 19 | 18 | 19 | 19 | 18 | 18 | 18 | 18 | 18 | 21 | 18 |
| | Intrinsic Viscosity (dl/g) | 0.67 | 0.66 | 0.67 | 0.66 | 0.65 | 0.66 | 0.66 | 0.66 | 0.66 | 0.66 | 0.65 | 0.66 |
| | Thickness (μm) | 20 | 10 | 50 | 20 | 20 | 20 | 20 | 20 | 20 | 20 | 20 | 20 |
| | Thickness Ratio (% (Based on Total)) | 8 | 4 | 20 | 8 | 8 | 6 | 10 | 7 | 7 | 8 | 8 | 8 |
| Layer B | Polyester Resin | PET-b | PET-b | PET-b | PET-b | PET-b | PET-b | PET-b | PET-b | PET-b | PET-b | PET-b | PET-b |
| | Amount of Polyester Resin (% by mass) | 100 | 100 | 100 | 100 | 100 | 100 | 100 | 100 | 100 | 100 | 100 | 98 |
| | Other Resin | — | — | — | — | — | — | — | — | — | — | — | MB-c |
| | Amount of Other Resin (% by mass) | — | — | — | — | — | — | — | — | — | — | — | 2 |
| | Content of White Pigment (% by mass) | 0 | 0 | 0 | 0 | 0 | 0 | 0 | 0 | 0 | 0 | 0 | 1 |
| | Acid Value (eq/ton) | 9 | 9 | 9 | 9 | 9 | 9 | 9 | 9 | 9 | 9 | 9 | 9 |
| | Intrinsic Viscosity (dl/g) | 0.71 | 0.71 | 0.71 | 0.71 | 0.71 | 0.71 | 0.71 | 0.71 | 0.71 | 0.71 | 0.71 | 0.71 |
| | Thickness (μm) | 115 | 120 | 100 | 60 | 160 | 150 | 90 | 125 | 125 | 115 | 115 | 115 |
| | Thickness Ratio (% (Based on Total)) | 46 | 48 | 40 | 24 | 64 | 47 | 45 | 46 | 46 | 46 | 46 | 46 |
| Layer C | Polyester Resin | PET-b | PET-b | PET-b | PET-b | PET-b | PET-b | PET-b | PET-b | PET-b | PET-b | PET-b | PET-b |
| | Amount of Polyester Resin (% by mass) | 92 | 92 | 92 | 92 | 92 | 92 | 92 | 86 | 98 | 92 | 92 | 92 |
| | Master Batch | MB-c | MB-c | MB-c | MB-c | MB-c | MB-c | MB-c | MB-c | MB-c | MB-c | MB-c | MB-c |
| | Amount of Master Batch (% by mass) | 8 | 8 | 8 | 8 | 8 | 8 | 8 | 14 | 2 | 8 | 8 | 8 |
| | Content of White | 4 | 4 | 4 | 4 | 4 | 4 | 4 | 7 | 1 | 4 | 4 | 4 |

TABLE 7-continued

|  | | Example 16 | Example 17 | Example 18 | Example 19 | Example 20 | Example 21 | Example 22 | Example 23 | Example 24 | Example 25 | Example 26 | Example 27 |
|---|---|---|---|---|---|---|---|---|---|---|---|---|---|
| | Pigment (% by mass) | | | | | | | | | | | | |
| | Acid Value (eq/ton) | 12 | 12 | 12 | 12 | 12 | 12 | 12 | 14 | 10 | 12 | 12 | 12 |
| | Intrinsic Viscosity (dl/g) | 0.70 | 0.70 | 0.70 | 0.70 | 0.70 | 0.70 | 0.70 | 0.68 | 0.70 | 0.70 | 0.70 | 0.70 |
| | Thickness (μm) | 115 | 120 | 100 | 170 | 70 | 150 | 90 | 125 | 125 | 115 | 115 | 115 |
| | Thickness Ratio (% (Based on Total)) | 46 | 48 | 40 | 68 | 28 | 47 | 45 | 46 | 46 | 46 | 46 | 46 |

Comparative Examples 7 to 13

The same procedure was carried out as in Example 16, except that the thicknesses and raw material compositions of the layer A, the layer B and the layer C were changed as shown in Table 8, to obtain a polyester film roll for sealing a back surface of a solar cell. Here, the thickness of each layer was adjusted by adjusting the discharge amount using a gear pump and by adjusting the outlet thickness of each layer in the feed-block. This was used as a sealing sheet for a back surface of a solar cell as it was.

Here, Comparative Example 8 was the sheet in which a white pigment was not added to both layer B and layer C (corresponding to the case where the layer C was not present), and Comparative Example 10 was the sheet produced so that both layer B and layer C contain 4% by mass of a white pigment (corresponding to the case where the layer B was not present).

Example 29

The same procedure was carried out as in Example 28, except for using 72% by mass of PETb and 3% by mass of MB-d, and further, 25% by mass of the resin pellet recycled from the film forming step of the film, as the raw materials of the layer C, to obtain a polyester film roll for sealing a back surface of a solar cell. This was used as a sealing sheet for a back surface of a solar cell as it was.

The resin pellet recycled from the film forming step of the film is obtained by cutting the portion held with clips of the tenter, collecting and drying it so as to have a moisture content of 30 ppm or less, and then extruding it into a strand shape with an extruder and cooling it with water to form into a resin chip.

TABLE 8

| | | Comparative Example 7 | Comparative Example 8 | Comparative Example 9 | Comparative Example 10 | Comparative Example 11 | Comparative Example 12 | Comparative Example 13 |
|---|---|---|---|---|---|---|---|---|
| Layer A | Polyester Resin | PET-b | PET-b | PET-b | PET-b | PET-b | PET-b | PET-b |
| | Amount of Polyester Resin (% by mass) | 70 | 70 | 70 | 70 | 70 | 20 | 84 |
| | Master Batch | MB-c | MB-c | MB-c | MB-c | MB-c | MB-c | MB-c |
| | Amount of Master Batch (% by mass) | 30 | 30 | 30 | 30 | 30 | 80 | 16 |
| | Content of White Pigment (% by mass) | 15 | 15 | 15 | 15 | 15 | 40 | 8 |
| | Acid Value (eq/ton) | 18 | 18 | 18 | 18 | 18 | 11 | 11 |
| | Intrinsic Viscosity (dl/g) | 0.66 | 0.66 | 0.66 | 0.66 | 0.66 | 0.66 | 0.66 |
| | Thickness (μm) | 20 | 20 | 20 | 20 | 20 | 20 | 20 |
| | Thickness Ratio (% (Based on Total)) | 6 | 6 | 8 | 8 | 8 | 8 | 8 |
| Layer B | Polyester Resin | PET-b | PET-b | PET-b | — | PET-b | PET-b | PET-b |
| | Amount of Polyester Resin (% by mass) | 100 | 100 | 100 | — | 100 | 100 | 100 |
| | Other Resin | — | — | — | — | — | — | — |
| | Amount of Other Resin (% by mass) | — | — | — | — | — | — | — |
| | Content of White Pigment (% by mass) | 0 | 0 | 0 | — | 0 | 0 | 0 |
| | Acid Value (eq/ton) | 9 | 9 | 9 | — | 9 | 9 | 9 |
| | Intrinsic Viscosity (dl/g) | 0.71 | 0.71 | 0.71 | — | 0.71 | 0.71 | 0.71 |
| | Thickness (μm) | 115 | 115 | 45 | — | 210 | 115 | 115 |
| | Thickness Ratio (% (Based on Total)) | 47 | 47 | 18 | — | 84 | 46 | 46 |
| Layer C | Polyester Resin | PET-b | PET-b | PET-b | PET-b | PET-b | PET-b | PET-b |
| | Amount of Polyester Resin (% by mass) | 76 | 100 | 92 | 92 | 70 | 92 | 92 |
| | Master Batch | MB-c | — | MB-c | MB-c | MB-c | MB-c | MB-c |
| | Amount of Master Batch (% by mass) | 24 | 0 | 8 | 8 | 30 | 8 | 8 |
| | Content of White Pigment (% by mass) | 12 | 0 | 4 | 4 | 15 | 4 | 4 |
| | Acid Value (eq/ton) | 17 | 9 | 12 | 12 | 18 | 14 | 14 |
| | Intrinsic Viscosity (dl/g) | 0.67 | 0.71 | 0.70 | 0.70 | 0.66 | 0.70 | 0.70 |
| | Thickness (μm) | 115 | 115 | 185 | 230 | 20 | 115 | 115 |
| | Thickness Ratio (% (Based on Total)) | 47 | 47 | 74 | 92 | 8 | 46 | 46 |

Example 28

The same procedure was carried out as in Example 16, except that the thicknesses and raw material compositions of the layer A, the layer B and the layer C were changed as shown in Table 9, to obtain a polyester film roll for sealing a back surface of a solar cell. This was used as a sealing sheet for a back surface of a solar cell as it was.

Example 30

The same procedure was carried out as in Example 29, except for using 90% by mass of PETb, and 10% by mass of the resin pellet recycled from the film forming step of the film, as the raw materials of the layer B, to obtain a polyester film roll for sealing a back surface of a solar cell. This was used as a sealing sheet for a back surface of a solar cell as it was.

Example 31

The film roll obtained in Example 29 was passed through an off-line coater set at a temperature of 160° C. and subjected to a relaxation treatment by adjusting the speed and the tension to obtain a polyester film roll for sealing a back surface of a solar cell. This was used as a sealing sheet for a back surface of a solar cell as it was.

Comparative Example 14

The same procedure was carried out as in Example 28, except for, without using the layer B, and using 72% by mass of PETb and 3% by mass of MB-d, and further, 25% by mass of the resin pellet recycled from the film forming step of the film, as the raw materials of the layer C, to obtain a polyester film roll for sealing a back surface of a solar cell. This was used as a sealing sheet for a back surface of a solar cell as it was.

TABLE 9

|  |  | Example 28 | Example 29 | Example 30 | Example 31 | Comparative Example 14 |
|---|---|---|---|---|---|---|
| Layer A | Polyester Resin | PET-b | PET-b | PET-b | PET-b | PET-b |
|  | Amount of Polyester Resin (% by mass) | 70 | 70 | 70 | 70 | 70 |
|  | Master Batch | MB-d | MB-d | MB-d | MB-d | MB-d |
|  | Amount of Master Batch (% by mass) | 30 | 30 | 30 | 30 | 30 |
|  | Content of White Pigment (% by mass) | 15 | 15 | 15 | 15 | 15 |
|  | Acid Value (eq/ton) | 14 | 14 | 14 | 14 | 14 |
|  | Intrinsic Viscosity (dl/g) | 0.70 | 0.70 | 0.70 | 0.70 | 0.70 |
|  | Thickness (μm) | 20 | 20 | 20 | 20 | 20 |
|  | Thickness Ratio (% (Based on Total)) | 8 | 8 | 8 | 8 | 8 |
| Layer B | Polyester Resin | PET-b | PET-b | PET-b | PET-b | — |
|  | Amount of Polyester Resin (% by mass) | 100 | 100 | 90 | 100 | — |
|  | Other Resin | — | — | Recycled Resin | — | — |
|  | Amount of Other Resin (% by mass) | — | — | 10 | — | — |
|  | Content of White Pigment (% by mass) | 0 | 0 | 0.5 | 0 | — |
|  | Acid Value (eq/ton) | 9 | 9 | 10 | 9 | — |
|  | Intrinsic Viscosity (dl/g) | 0.71 | 0.71 | 0.70 | 0.71 | — |
|  | Thickness (μm) | 115 | 115 | 115 | 115 | — |
|  | Thickness Ratio (% (Based on Total)) | 46 | 46 | 46 | 46 | — |
| Layer C | Polyester Resin | PET-b | PET-b | PET-b | PET-b | PET-b |
|  | Amount of Polyester Resin (% by mass) | 92 | 72 | 72 | 72 | 72 |
|  | Master Batch | MB-d | MB-d | MB-d | MB-d | MB-d |
|  | Amount of Master Batch (% by mass) | 8 | 3 | 3 | 3 | 3 |
|  | Amount of Recycled Resin Used (% by mass) | 0 | 25 | 25 | 25 | 25 |
|  | Content of White Pigment (% by mass) | 4 | 4 | 4 | 4 | 4 |
|  | Acid Value (eq/ton) | 10 | 14 | 14 | 14 | 14 |
|  | Intrinsic Viscosity (dl/g) | 0.70 | 0.66 | 0.66 | 0.66 | 0.66 |
|  | Thickness (μm) | 115 | 115 | 115 | 115 | 230 |
|  | Thickness Ratio (% (Based on Total)) | 46 | 46 | 46 | 46 | 92 |

Characteristics of the sealing sheets for a back surface of a solar cell obtained in Examples and Comparative Examples were shown in Tables 10 to 12.

TABLE 10

|  | Example 16 | Example 17 | Example 18 | Example 19 | Example 20 | Example 21 | Example 22 | Example 23 | Example 24 | Example 25 | Example 26 | Example 27 |
|---|---|---|---|---|---|---|---|---|---|---|---|---|
| Total Content of White Pigment (% by mass) | 4.8 | 3.7 | 9.1 | 6.3 | 4.7 | 4.9 | 4.8 | 6.2 | 3.5 | 4.2 | 7.0 | 5.3 |
| Total Acid Value (en/ton) | 11 | 11 | 12 | 12 | 11 | 11 | 11 | 12 | 10 | 11 | 11 | 11 |
| Total Intrinsic Viscosity (dl/g) | 0.70 | 0.70 | 0.70 | 0.70 | 0.70 | 0.70 | 0.70 | 0.69 | 0.70 | 0.70 | 0.70 | 0.70 |
| Total Thickness (μm) | 250 | 250 | 250 | 250 | 250 | 320 | 200 | 270 | 270 | 250 | 250 | 250 |
| Apparent Density (g/cm³) | 1.39 | 1.39 | 1.39 | 1.39 | 1.39 | 1.39 | 1.39 | 1.39 | 1.39 | 1.39 | 1.39 | 1.39 |
| Whiteness | 95 | 93 | 95 | 96 | 95 | 95 | 95 | 95 | 95 | 90 | 95 | 95 |
| Average Reflectance (%) | 77 | 71 | 84 | 77 | 78 | 77 | 77 | 77 | 77 | 72 | 82 | 77 |
| Variation of Light Reflectance (%) | 2 | 2 | 2 | 2 | 2 | 2 | 2 | 2 | 2 | 2 | 2 | 2 |
| Breaking Elongation Retention after Accelerated Hydrolysis (%) | ⊚ | ⊚ | ⊚ | ◯ | ⊚ | ⊚ | ⊚ | ⊚ | ⊚ | ⊚ | ⊚ | ⊚ |
| Breaking Elongation Retention after Accelerated Photo Degradation (%) | ⊚ | ⊚ | ⊚ | ⊚ | ⊚ | ⊚ | ⊚ | ⊚ | ⊚ | ⊚ | ⊚ | ⊚ |
| Change of Color b* Value | ⊚ | ⊚ | ⊚ | ⊚ | ⊚ | ⊚ | ⊚ | ⊚ | ⊚ | ◯ | ⊚ | ⊚ |
| H5150 (%) | 2.5 | 2.4 | 2.3 | 2.4 | 2.3 | 2.5 | 2.3 | 2.4 | 2.4 | 2.3 | 2.4 | 2.4 |
| MOR-C | 1.7 | 1.73 | 1.72 | 1.74 | 1.73 | 1.75 | 1.68 | 1.71 | 1.72 | 1.72 | 1.73 | 1.74 |
| Surface Strength | ◯ | ◯ | ◯ | ◯ | ◯ | ◯ | ◯ | ◯ | ◯ | ◯ | △ | ◯ |
| Partial Discharge Voltage (V) | ◯ | ◯ | ◯ | ◯ | ◯ | ◯ | △ | ◯ | ◯ | ◯ | ◯ | ◯ |
| Water Vapor Permeability (g/m²/d) | 2.3 | 2.3 | 2.3 | 2.2 | 2.3 | 1.9 | 2.9 | 2.3 | 2.3 | 2.2 | 2.3 | 2.3 |

TABLE 10-continued

|  | Example 16 | Example 17 | Example 18 | Example 19 | Example 20 | Example 21 | Example 22 | Example 23 | Example 24 | Example 25 | Example 26 | Example 27 |
|---|---|---|---|---|---|---|---|---|---|---|---|---|
| Adhesion | ○ | ○ | ○ | ○ | ○ | ○ | ○ | ○ | ○ | ○ | ○ | ○ |
| Retention of Adhesive Strength | ○ | ○ | ○ | ○ | ○ | ○ | ○ | Δ | ○ | ○ | ○ | ○ |
| Appearance Change | ○ | ○ | ○ | ○ | ○ | ○ | ○ | ○ | ○ | Δ | ○ | ○ |

TABLE 11

|  | Comparative Example 7 | Comparative Example 8 | Comparative Example 9 | Comparative Example 10 | Comparative Example 11 | Comparative Example 12 | Comparative Example 13 |
|---|---|---|---|---|---|---|---|
| Total Content of White Pigment (% by mass) | 3.7 | 3.7 | 6.0 | 6.7 | 4.2 | 9.8 | 3.4 |
| Total Acid Value (eq/ton) | 8 | 8 | 12 | 7 | 10 | 11 | 11 |
| Total Intrinsic Viscosity (dl/g) | 0.69 | 0.71 | 0.70 | 0_70 | 0.70 | 0.70 | 0.70 |
| Total Thickness (μm) | 250 | 250 | 250 | 250 | 250 | 250 | 250 |
| Apparent Density (g/cm³) | 1.39 | 1.39 | 139 | 1.39 | 1.39 | 1.39 | 1.39 |
| Whiteness | 95 | 95 | 95 | 95 | 95 | 96 | 63 |
| Average Reflectance (%) | 77 | 76 | 77 | 77 | 77 | 85 | 70 |
| Variation of Light Reflectance (%) | 2 | 2 | 2 | 2 | 2 | 3 | 1 |
| Breaking Elongation Retention after Accelerated Hydrolysis (%) | ◎ | ◎ | Δ | X | ◎ | ◎ | ◎ |
| Breaking Elongation Retention after Accelerated Photo Degradation (%) | ◎ | ◎ | ◎ | ◎ | ◎ | ◎ | X |
| Change of Color b* Value | ◎ | ○ | ◎ | ◎ | ◎ | ◎ | X |
| HS150 (%) | 2.4 | 2.3 | 2.4 | 2.5 | 2.4 | 2.5 | 2.4 |
| MOR-C | 1.73 | 1.74 | 1.74 | 1.72 | 1.73 | 1.74 | 1.73 |
| Surface Strength | ○ | ○ | ○ | ○ | ○ | X | ○ |
| Partial Discharge Voltage (V) | ○ | ○ | ○ | ○ | ○ | ○ | ○ |
| Water Vapor Permeability (g/m²/d) | 2.4 | 2.3 | 2.3 | 2.3 | 2.4 | 2.4 | 2.2 |
| Adhesion | ○ | ○ | ○ | ○ | ○ | ○ | ○ |
| Retention of Adhesive Strength | X | ○ | ○ | ○ | X | ○ | ○ |
| Appearance Change | × (Peeling) | × (Yellowing on Light Receiving Surface) | × (Crack in Inner Layer Part When Hold to Light | × (Crack) | × (Peeling) | ○ | × (Yellowing and Crack) |

TABLE 12

|  | Example 28 | Example 29 | Example 30 | Example 31 | Comparative Example 14 |
|---|---|---|---|---|---|
| Total Content of White Pigment (% by mass) | 4.8 | 4.8 | 5.1 | 4.8 | 6.7 |
| Total Acid Value (eq/ton) | 10 | 12 | 12 | 12 | 14 |
| Total Intrinsic Viscosity (dl/g) | 0.70 | 0.69 | 0.68 | 0.69 | 0.66 |
| Total Thickness (μm) | 250 | 250 | 250 | 250 | 250 |
| Apparent Density (g/cm³) | 1.39 | 1.39 | 1.39 | 1.39 | 1.39 |
| Whiteness | 95 | 95 | 95 | 95 | 95 |
| Average Reflectance (%) | 77 | 77 | 77 | 77 | 77 |
| Variation of Light Reflectance (%) | 2 | 2 | 2 | 2 | 2 |
| Breaking Elongation Retention after Accelerated Hydrolysis (%) | ⊙ | ⊙ | ⊙ | ⊙ | X |
| Breaking Elongation Retention after Accelerated Photo Degradation (%) | ⊙ | ⊙ | ⊙ | ⊙ | ⊙ |
| Change of Color b* Value | ⊙ | ⊙ | ⊙ | ⊙ | ⊙ |
| HS150 (%) | 2.4 | 2.3 | 2.4 | 0.4 | 2.4 |
| MOR-C | 1.73 | 1.72 | 1.72 | 1.72 | 1.73 |
| Surface Strength | ○ | ○ | ○ | ○ | ○ |
| Partial Discharge Voltage (V) | ○ | ○ | ○ | ○ | ○ |
| Water Vapor Permeability (g/m²/d) | 2.3 | 2.3 | 2.2 | 2.3 | 2.3 |
| Adhesion | ○ | ○ | ○ | ○ | ○ |
| Retention of Adhesive Strength | ○ | ○ | ○ | ○ | ○ |
| Appearance Change | ○ | ○ | ○ | ○ | × (Crack) |

<Preparation of Solar Cell Module>

A tempered glass (300 mm×200 mm, thickness of 3 mm), an EVA sheet (UltraPearl (registered trademark) PV (0.45 mm) manufactured by SANVIC INC., a crystalline solar cell (150 mm×155 mm), the same EVA sheet and a sealing sheet for a back surface of a solar cell of each Example were superposed in this order, and the sealing sheet for a back surface of a solar cell and the EVA sheet were adhered using a vacuum laminator (at 135° C., for 5 minutes in vacuo and for 15 minutes with pressure in vacuo) to prepare a solar cell module. The resulting solar cell module was retained at 85° C., under an atmosphere of 85% RH, for 3000 hours. Thereafter, the appearance of the sealing sheet for a back surface of a solar cell was observed, but peeling, cracks, yellowing and the like at the end surface were not found in all samples, and initial appearance was mostly maintained.

INDUSTRIAL APPLICABILITY

The sealing sheet for a back surface of a solar cell of the present invention has good whiteness and light reflectivity, is excellent in environmental durability represented by light resistance and hydrolysis resistance, and exhibits good electric insulation. By using the sealing sheet for a back surface of a solar cell of the present invention, a solar cell module that is excellent in environmental durability and is inexpensive and light in weight can be provided.

The invention claimed is:

1. A sealing sheet for a back surface of a solar cell consisting of only one polyester film consisting of polyethylene terephthalate homopolymer as the polymeric component,
wherein
the polyester film is composed of (a) layer A and layer B or (b) layer A, layer B, and layer C, wherein the layer A, the layer B, and the layer C are laminated in this order,
the polyester film has a whiteness of 50 or more, an average reflectance of 50 to 95% in the range of a wavelength of 400 to 800 nm, an acid value of polyester constituting the polyester film of 1 to 50 eq/ton, and a thickness of 150 to 380 μm,
the polyester film has a multilayer structure in which the layer A is disposed as an outermost layer opposite to the back surface of the solar cell,
the thickness of the layer A is 3 to 30% of the thickness of the whole polyester film,
the thickness of the layer B is 20% or more of the thickness of the whole polyester film,
the content of inorganic fine particles in the whole polyester film is 0.5 to 2.7% by mass,
the layer B does not contain voids,
layer A is a polyester resin layer in which the content of the inorganic fine particles is 18 to 35% by mass,
layer B is a polyester resin layer in which the content of the inorganic fine particles is 0 to 2% by mass, which is the smallest among the contents of the inorganic fine particles in the layer A, the layer B and the layer C, and
layer C is a polyester resin layer in which the content of the inorganic fine particles is 0.4 to 10% by mass.

2. The sealing sheet for a back surface of a solar cell according to claim 1, wherein the inorganic fine particles are titanium dioxide comprising a rutile type.

3. The sealing sheet for a back surface of a solar cell according to claim 2, wherein the polyester film has a thermal shrinkage rate in the longitudinal direction at 150° C. of 0.2 to 3.0%.

4. The sealing sheet for a back surface of a solar cell according to claim 3, wherein the polyester film has a breaking elongation retention after accelerated hydrolysis test in the treatment conditions of 105° C., 100% RH and 0.03 MPa for 200 hours of 50 to 100%.

5. The sealing sheet for a back surface of a solar cell according to claim 4, wherein the polyester film has a breaking elongation retention after accelerated photo degradation test in the irradiation conditions of 63° C., 50% RH and UV irradiation intensity of 100 mW/cm$^2$ for 100 hours of 35% or more.

6. The sealing sheet for a back surface of a solar cell according to claim 5, wherein the polyester film has a change of the color b* value after accelerated photo degradation test in the irradiation conditions of 63° C., 50% RH and UV irradiation intensity of 100 mW/cm$^2$ for 100 hours of 12 or less.

7. The sealing sheet for a back surface of a solar cell according to claim 6, wherein a coating layer containing a polyurethane resin comprising an aliphatic polycarbonate polyol as a constituent is disposed on a surface of the layer B of (a) layer A and layer B or on the layer C of (b) layer A, layer B, and layer C of the polyester film.

8. The sealing sheet for a back surface of a solar cell according to claim 7, wherein the polyester resin constituting the layer B has an intrinsic viscosity of 0.63 to 0.90 dl/g and an acid value of 25 eq/ton or less.

9. The sealing sheet for a back surface of a solar cell according to claim 8, wherein the layer C comprises a recycled polyester resin.

10. The sealing sheet for a back surface of a solar cell according to claim 9, wherein the polyester film is composed of the layer A, the layer B, and the layer C.

11. The sealing sheet for a back surface of a solar cell according to claim 1, wherein the polyester film has a thermal shrinkage rate in the longitudinal direction at 150° C. of 0.2 to 3.0%.

12. The sealing sheet for a back surface of a solar cell according to claim 1, wherein the polyester film has a breaking elongation retention after accelerated hydrolysis test in the treatment conditions of 105° C., 100% RH and 0.03 MPa for 200 hours of 50 to 100%.

13. The sealing sheet for a back surface of a solar cell according to claim 1, wherein the polyester film has a breaking elongation retention after accelerated photo degradation test in the irradiation conditions of 63° C., 50% RH and UV irradiation intensity of 100 mW/cm$^2$ for 100 hours of 35% or more.

14. The sealing sheet for a back surface of a solar cell according to claim 1, wherein the polyester film has a change of the color b* value after accelerated photo degradation test in the irradiation conditions of 63° C., 50% RH and UV irradiation intensity of 100 mW/cm$^2$ for 100 hours of 12 or less.

15. The sealing sheet for a back surface of a solar cell according to claim 1, wherein a coating layer containing a polyurethane resin comprising an aliphatic polycarbonate polyol as a constituent is disposed on a surface of the layer B of (a) layer A and layer B or on the layer C of (b) layer A, layer B, and layer C of the polyester film.

16. The sealing sheet for a back surface of a solar cell according to claim 1, wherein the polyester resin constituting the layer B has an intrinsic viscosity of 0.63 to 0.90 dl/g and an acid value of 25 eq/ton or less.

17. The sealing sheet for a back surface of a solar cell according to claim 1, wherein the layer C comprises a recycled polyester resin.

18. The sealing sheet for a back surface of a solar cell according to claim 1, wherein the polyester film is composed of the layer A, the layer B, and the layer C.

19. The sealing sheet for a back surface of a solar cell according to claim 18, wherein a coating layer is disposed on a surface of the layer C.

20. A solar cell module comprising the sealing sheet for a back surface of a solar cell according to claim 1, an encapsulation resin layer adjacent to the sealing sheet for a back surface of a solar cell, and a solar cell device embedded in the encapsulation resin layer.

* * * * *